(12) United States Patent
Kim

(10) Patent No.: US 11,985,860 B2
(45) Date of Patent: May 14, 2024

(54) DISPLAY DEVICE INCLUDING NARROW BENT AREA

(71) Applicant: Samsung Display Co., Ltd., Yongin-Si (KR)

(72) Inventor: Kyongjun Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 211 days.

(21) Appl. No.: 17/379,912

(22) Filed: Jul. 19, 2021

(65) Prior Publication Data
US 2022/0123076 A1 Apr. 21, 2022

(30) Foreign Application Priority Data
Oct. 20, 2020 (KR) ........................ 10-2020-0135809

(51) Int. Cl.
| | |
|---|---|
| *H10K 50/84* | (2023.01) |
| *H10K 50/844* | (2023.01) |
| *H10K 59/12* | (2023.01) |
| *H10K 59/122* | (2023.01) |
| *G02F 1/1333* | (2006.01) |

(Continued)

(52) U.S. Cl.
CPC ......... *H10K 59/122* (2023.02); *H10K 50/844* (2023.02); *G02F 1/133305* (2013.01); *G06F 1/1641* (2013.01); *G06F 1/1652* (2013.01); *G09G 2300/0408* (2013.01); *H10K 50/12* (2023.02); *H10K 50/816* (2023.02); *H10K 50/828* (2023.02); *H10K 59/1216* (2023.02); *H10K 59/40* (2023.02)

(58) Field of Classification Search
CPC .. H10K 50/8426; H10K 50/844; H10K 50/12; H10K 50/816; H10K 50/828; H10K 59/122; H10K 59/124; H10K 59/121; H10K 59/88; H10K 59/1213; H10K 59/123; H10K 59/40; H10K 59/1216; H10K 77/111; H10K 2102/311; G02F 1/133305; G06F 1/1641; G06F 1/1652; G09F 9/301; G09G 2300/0408
See application file for complete search history.

(56) References Cited

U.S. PATENT DOCUMENTS

| | | |
|---|---|---|
| 9,983,714 B2 | 5/2018 | Ahn |
| 10,481,729 B2 | 11/2019 | Park |

(Continued)

FOREIGN PATENT DOCUMENTS

| | | | | |
|---|---|---|---|---|
| EP | 3460622 A2 | * | 3/2019 | ........... G06F 1/1626 |
| KR | 20180112203 A | * | 10/2018 | ......... H01L 27/1244 |

(Continued)

*Primary Examiner* — Ida M Soward
(74) *Attorney, Agent, or Firm* — Innovation Counsel LLP

(57) ABSTRACT

A display device may include a substrate, a display element, and an organic insulating layer. The substrate may include a first area, a second area, and a bent area. The bent area may be connected between the first area and the second area, may be bent according to a bending axis, and may be narrower than the first area in a direction parallel to the bending axis. The display element may overlap the substrate. The organic insulating layer may be spaced from the display element, may be arranged at an edge of the substrate, and may only partially overlap a first face of the substrate. A face of the organic insulating layer may be coplanar with a second face of the substrate.

20 Claims, 13 Drawing Sheets

(51) Int. Cl.
*G06F 1/16* (2006.01)
*H10K 50/12* (2023.01)
*H10K 50/816* (2023.01)
*H10K 50/828* (2023.01)
*H10K 59/121* (2023.01)
*H10K 59/40* (2023.01)

(56) References Cited

U.S. PATENT DOCUMENTS

| | | | | |
|---|---|---|---|---|
| 10,497,896 | B2 | 12/2019 | Lee et al. | |
| 2018/0005568 | A1* | 1/2018 | Kim | H10K 77/111 |
| 2018/0047802 | A1* | 2/2018 | Yoon | H10K 59/131 |
| 2018/0053816 | A1* | 2/2018 | Choi | H10K 50/844 |
| 2018/0197484 | A1* | 7/2018 | Moon | H01L 27/12 |
| 2018/0343753 | A1* | 11/2018 | Kim | H05K 1/0313 |
| 2019/0013373 | A1* | 1/2019 | Lee | H10K 59/131 |
| 2019/0206968 | A1* | 7/2019 | Yang | H10K 59/131 |
| 2019/0318689 | A1* | 10/2019 | Kim | H05K 1/0281 |
| 2019/0391454 | A1* | 12/2019 | Koide | H01L 27/124 |
| 2020/0019031 | A1* | 1/2020 | Koide | G02F 1/136286 |
| 2020/0185428 | A1* | 6/2020 | Um | G02F 1/133345 |
| 2020/0203467 | A1* | 6/2020 | Ohara | G02F 1/1345 |
| 2020/0301541 | A1* | 9/2020 | Jeon | G06F 1/1643 |
| 2020/0321429 | A1* | 10/2020 | Yang | H10K 59/131 |
| 2020/0388784 | A1 | 12/2020 | Kim et al. | |
| 2020/0401274 | A1* | 12/2020 | Moon | G06F 3/0445 |
| 2021/0004112 | A1* | 1/2021 | Miyamoto | G06F 3/0448 |
| 2021/0026497 | A1* | 1/2021 | Lee | G06F 3/0448 |
| 2021/0041972 | A1* | 2/2021 | Kim | G06F 3/04164 |
| 2021/0249631 | A1* | 8/2021 | Kokame | H10K 59/122 |

FOREIGN PATENT DOCUMENTS

| | | | | |
|---|---|---|---|---|
| KR | 10-2019-0009147 A | | 1/2019 | |
| KR | 20200029681 A | * | 3/2020 | ........... H10K 59/351 |
| TW | 202036114 A | * | 10/2020 | ........... H10K 77/111 |

* cited by examiner

DISPLAY DEVICE INCLUDING NARROW BENT AREA

CROSS-REFERENCE TO RELATED APPLICATION

This application claims priority under 35 U.S.C. § 119 to Korean Patent Application No. 10-2020-0135809, filed on Oct. 20, 2020, in the Korean Intellectual Property Office; the Korean Patent Application is incorporated by reference.

BACKGROUND

Field

The technical field relates to display devices.

Description of Related Art

Display device may display images according to input signals. Display devices may be included in various electronic devices. Modern electronic devices include mobile devices, such as mobile phones.

SUMMARY

Embodiments may be related to a display device that includes a bent structure. The bent structure may minimize the footprint of the display device.

In embodiments, defects in or near the bent structure (potentially occurring in the manufacturing or use of the display device) may be minimized.

According to one embodiment, a display device includes a substrate having a bending area located between a first area and a second area and being bent with respect to a bending axis, and an organic insulating layer arranged at an end of an edge of the substrate, wherein, on a plane, a width of the bending area is less than a width of the first area.

The organic insulating layer may include a same layer as at least one layer from among a planarization layer, a pixel-defining layer, and a spacer.

The display device may further include an inorganic insulating layer arranged between the substrate and the organic insulating layer.

The organic insulating layer in the second area may be arranged on the inorganic insulating layer.

The display device may further include a buffer layer arranged between the substrate and the organic insulating layer.

At least a portion of the organic insulating layer in the first area may be arranged on the buffer layer.

The first area may include a display area, and a peripheral area surrounding the display area.

The display area may further include a crack blocking unit arranged in the peripheral area to surround at least a portion of the display area.

At least a portion of the organic insulating layer may be arranged to shield the crack blocking unit.

The display device may further include a bending protection layer arranged in the bending area.

According to another embodiment, a display device includes a substrate including a first side, a second side, and a third side, which are connected to one another, a pair of fourth sides respectively connected to the second side and the third side and in which at least a portion thereof is round, and a fifth side connected to each of the fourth sides, and an organic insulating layer arranged on the substrate in at least a portion of the first side to the fifth side.

A portion of an interval between the pair of fourth sides may decrease from the first side to the fifth side.

The display device may further include a crack blocking unit arranged on the substrate so as to correspond to at least a portion of the first side, the second side, and the third side.

At least a portion of the organic insulating layer may be arranged on the crack blocking unit.

The substrate may be bent in at least a portion of the pair of fourth sides.

The display device may further include a bending protection layer arranged on a bending portion of the substrate.

The organic insulating layer may be arranged on the substrate so as to overlap the bending protection layer in a plan view.

The organic insulating layer may be arranged in a closed-loop shape along the first side to the fifth side.

A thickness of the organic insulating layer may be constant on the first side, the second side, and the third side.

A thickness of the organic insulating layer on one of the fourth side or the fifth side may be different from a thickness of the organic insulating layer on one of the first side, the second side, or the third side.

An embodiment may be related to a display device. The display device may include a substrate, a display element, and an organic insulating layer. The substrate may include a first area, a second area, and a bent area. The bent area may be connected between the first area and the second area, may be bent according to a bending axis, and may be narrower than the first area in a direction parallel to the bending axis. The display element may overlap the substrate. The organic insulating layer may be spaced from the display element, may be arranged at an edge of the substrate, and may only partially overlap a first face of the substrate. A face of the organic insulating layer may be coplanar with a second face of the substrate.

The display device may include the following elements: a planarization layer spaced from the organic insulating layer and positioned between the display element and the substrate; a pixel-defining layer spaced from the organic insulating layer and directly contacting the display element; and a spacer spaced from the organic insulating layer. The pixel-defining may be positioned between the spacer and the substrate. The organic insulating layer may be formed of a same material as at least one of the planarization layer, the pixel-defining layer, and the spacer.

The display device may include an inorganic insulating layer arranged between the substrate and the organic insulating layer.

The inorganic insulating layer may be positioned between the second area and the organic insulating layer.

The display device may include a buffer layer arranged between the substrate and the organic insulating layer.

The buffer layer may be positioned between the organic insulating layer and the first area.

The first area may include a display area and a peripheral area surrounding the display area. The display element may overlap the display area.

The display device may include a crack blocking unit. The crack blocking unit may be arranged on the peripheral area and may include a slit.

The organic insulating layer may cover at least one of the crack blocking unit and the slit.

The display device may include a bending protection layer overlapping the bent area and partially overlapping the organic insulating layer. The organic insulating layer may be positioned between the bending protection layer and the bent area.

An embodiment may be related to a display device. The display device may include a substrate, a display element, and an organic insulating layer. The substrate may include a first edge; a second edge; a third edge connected between the first edge and the second edge; two fourth edges each having a curved section; and a fifth edge connected through the two fourth edges to the first edge and the second edge, respectively. The display element may overlap the substrate. The organic insulating layer may be spaced from the display element and may only partially overlap a first face of the substrate. A first face of the organic insulating layer may be coplanar with the first edge, the second edge, the third edge, a straight section of one of the two fourth edges, or the fifth edge.

Widths of the substrate between the two fourth edges may decrease toward the fifth edge.

The display device may include a crack blocking unit overlapping the substrate and including a slit. A first portion of the organic insulating layer may be positioned between the slit and the first edge, the second edge, or the third edge.

A second portion of the organic insulating layer may cover at least one of the crack blocking unit and the slit.

The two fourth edges may be bent according to a same bending axis.

The display device may include a bending protection layer covering a bent portion of the substrate that is positioned between the two fourth edges.

The bending protection layer may partially overlap the organic insulation layer. The organic insulating layer may be arranged between the bending protection layer and the bent portion of the substrate.

The organic insulating layer may include four faces respectively coplanar with the first edge, the second edge, the third edge, and the fifth edge and may include two surfaces respectively conforming to the two fourth edges. The two surfaces of the organic insulating layer may match the curvatures and shapes of the two fourth edges, respectively.

A thickness of the organic insulating layer may be constant on the first edge, the second edge, and the third edge.

A thickness of the organic insulating layer on one of the two fourth edges or the fifth edge may be unequal to a thickness of the organic insulating layer on one of the first edge, the second edge, and the third edge.

DETAILED DESCRIPTION

Figure 1:
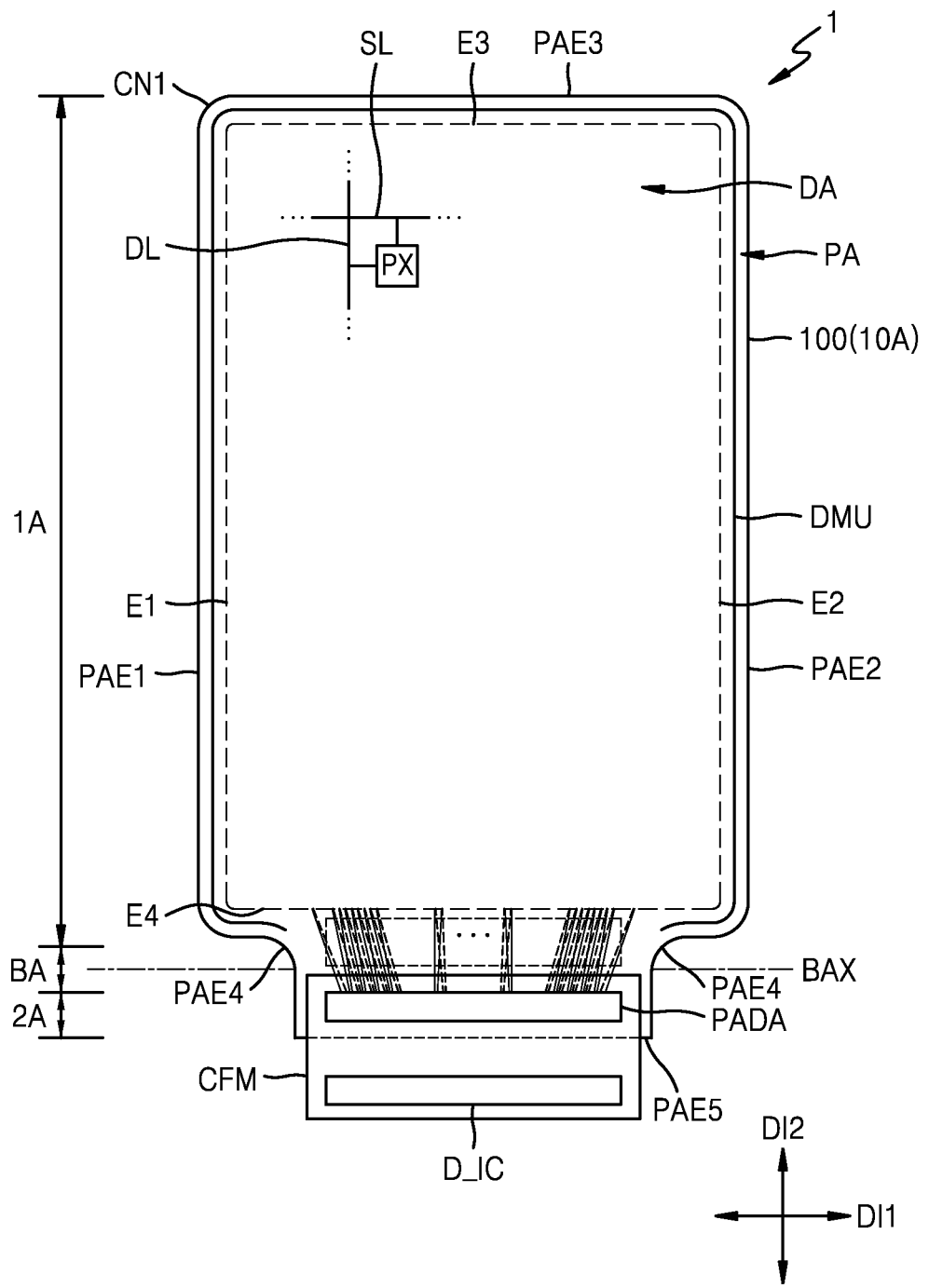
FIG. 1 is a plan view illustrating a display device according to an embodiment.

Example embodiments are described with reference to the accompanying drawings, wherein like reference numerals may refer to like elements. The described embodiments may have different forms and configurations and should not be construed as being limited to the description.

While the terms "first," "second," etc., may be used to describe various elements, the elements are not to be limited to these terms. These terms are used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

An expression used in the singular may encompass an expression of the plural unless the context expressly indicates otherwise.

The terms "comprise," "include," and "have" specify the presence of stated features or elements, but may not preclude the presence or addition of one or more other features or elements.

When a first element is referred to as being "on" a second element, the first element can be "directly on" or "indirectly on" the second element. One or more intervening elements may be between the first element and the second element.

Dimensions of elements in the drawings may be exaggerated for convenience of explanation and may not limit the illustrated embodiments.

When an embodiment may be implemented differently, a process order may be different from the described order. For example, two consecutive processes may be performed substantially at the same time or performed in an order opposite to the described order.

The term "side" may mean "edge." The term "connected" may mean "directly connected," "indirectly connected," "electrically connected," or "electrically connected through no intervening transistor." The term "insulate" may mean "electrically insulate" or "electrically isolate." The term "conductive" may mean "electrically conductive." The term "drive" may mean "operate" or "control." The term "bending area" may mean "bent area." The term "area" may mean "part" or "section." A listing of materials may mean at least one of the listed materials. The term "layer" may mean "layer set" or "set of layers." The term "wall" may mean "wall set" or "set of walls."

Figure 2:
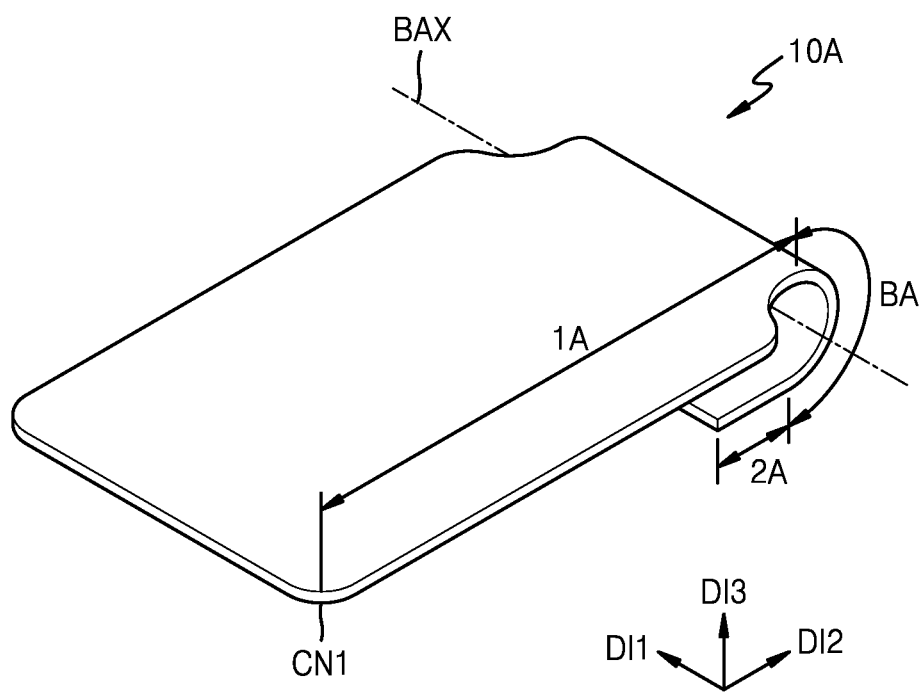
FIG. 2 is a perspective view illustrating a display panel of the display device shown in FIG. 1 according to an embodiment.

FIG. 1 is a plan view illustrating a display device 1 according to an embodiment. FIG. 2 is a perspective view illustrating a display panel 10A of the display device 1 shown in FIG. 1 according to an embodiment.

Referring to FIGS. 1 and 2, the display device 1 may include a display panel 10A and a connection film CFM.

The display panel 10A may include a display area DA for displaying an image and may include a peripheral area PA located outside the display area DA. A substrate 100 provided in the display panel 10A may include a corresponding display area DA and a corresponding peripheral area PA.

The substrate 100 may include a first area 1A, a second area 2A, and a bending area BA. The first area 1A may include part of the display area DA and part of the peripheral area PA. The second area 2A may include part of the peripheral area PA, which may include a pad area PADA. The bending area BA may connect the first area 1A and the second area 2A to each other. Conductive lines may pass through the bending area BA between the areas 1A and 2A.

The substrate 100 may extend in a first direction DI1. The bending area BA of the display panel 10A may be bent with respect to (and about) a bending axis BAX in a process of manufacturing the display device 1. The substrate 100 may have a substantially flat shape before being bent in a process of manufacturing the display panel 10A, wherein the bending area BA may be located between the first area 1A and the second area 2A in a second direction DI2 different from (e.g., perpendicular to) the first direction DI1. Referring to FIG. 1 and FIG. 2, the substrate 100 may be bent with respect to a bending axis BAX extending in the first direction DI1. FIG. 1 shows that the first area 1A has a shape of a substantial rectangle with rounded corners CN1. The first area 1A may have a substantially circular shape and/or one or more other shapes. Referring to FIG. 2, the bending area BA may be bent relative to the first area 1A and relative to a boundary between the areas 1A and BA.

The substrate 100 may include sides. For example, the substrate 100 may include a first side PAE1, a second side PAE2, a third side PAE3, which define part of the first area 1A, a pair of fourth sides PAE4 connecting the first area 1A to the second area 2A, and a fifth side PAE5 connected to each of the fourth sides PAE4. Each of the first side PAE1, the second side PAE2, the third side PAE3, and the fifth side PAE5 may be a straight line. A corner at which the third side PAE3 and the second side PAE2 meet and a corner at which the first side PAE1 and the third side PAE3 meet may be curved. At least a portion of the fourth sides PAE4 may be curved. For example, a portion of a fourth side PAE4 connected to the second side PAE2 or the first side PAE1 may be curved, and a portion of two straight sections of a fourth side PAE4 may be curved. Distances between the fourth sides PAE4 may be variable. Distance between the fourth sides PAE4 may decrease from the display area DA to the pad area PADA. The distances between the fourth sides PAE4 may be measured in the first direction DI1.

A perimeter of the display area DA (arranged in the first area 1A) may have a substantially rectangular shape with curved corners and/or right-angled corners.

The display area DA may include a first edge E1 and a second edge E2 facing each other and may include a third edge E3 and a fourth edge E4 located between the first edge E1 and the second edge E2 and facing each other.

The pad area PADA may be adjacent to the fourth edge E4. A corner at which the first edge E1 or the second edge E2 is connected to the third edge E3 or the fourth edge E4 may be rounded.

Pixels PX and lines for transmitting electrical signals to the pixels PX may be located in the display area DA.

Each of the pixels PX may include a display element and a circuit unit for driving the display element. The display element may be an organic light-emitting device, and the circuit unit may include transistors, a capacitor, etc.

Signal lines for transmitting electrical signals to the pixels PX may include scan lines SL, data lines DL, etc. Each of the scan lines SL may extend in the first direction DI1, and each of the data lines DL may extend in the second direction DI2. The scan lines SL may transmit scan signals to the pixels PX, and the data lines DL may transmit a data signals to the pixels PX. Each of the pixels PX may be connected to a corresponding scan line SL and a corresponding data line DL.

The peripheral area PA may surround the display area DA. The peripheral area PA may accommodate no pixels PX and may include the pad area PADA that supports or accommodates various electronic elements, printed circuit boards, and a power line.

A crack blocking unit DMU corresponding to at least a portion of the display area DA may be arranged in the peripheral area PA. The crack blocking unit DMU may be spaced from the display area DA.

The crack blocking unit DMU may be integrally formed. The crack blocking unit DMU may have an opening facing the pad area PADA to allow a power line or the like to pass. The crack blocking unit DMU may include blocks that are spaced from each other in a plan view. The blocks may face the first edge E1, the second edge E2, and the third edge E3 of the display area DA.

The crack blocking unit DMU may not be arranged in the bending area BA. The crack blocking unit DMU may prevent layers of the display panel 10A from being separated from each other when the display panel 10A is bent, or may prevent cracks occurring in an edge portion of the display panel 10A from extending to the display area DA.

Pads in the pad area PADA may be electrically connected to the connection film CFM, which supports and is electrically connected to a driving integrated circuit (IC) D_IC. FIG. 1 shows a Chip-on-Film (COF) scheme in which the driving IC D_IC is arranged on the connection film CFM electrically connected to the pads on the substrate 100. The driving IC D_IC may be directly arranged on the substrate 100 using a Chip-on-Glass (COG) scheme or Chip-on-Plastic (COP) scheme.

The peripheral area PA may include the bending area BA, and the bending area BA may be located between the pad area PADA and the display area DA. The substrate 100 may be bent in the bending area BA so that at least a portion of the pad area PADA may overlap the display area DA. A bending direction may be set so that the pad area PADA is located behind the display area DA instead of covering the display area DA. Accordingly, a user of the display device 1 may perceive that the display area DA occupies most of the display panel 10A.

Figure 3:
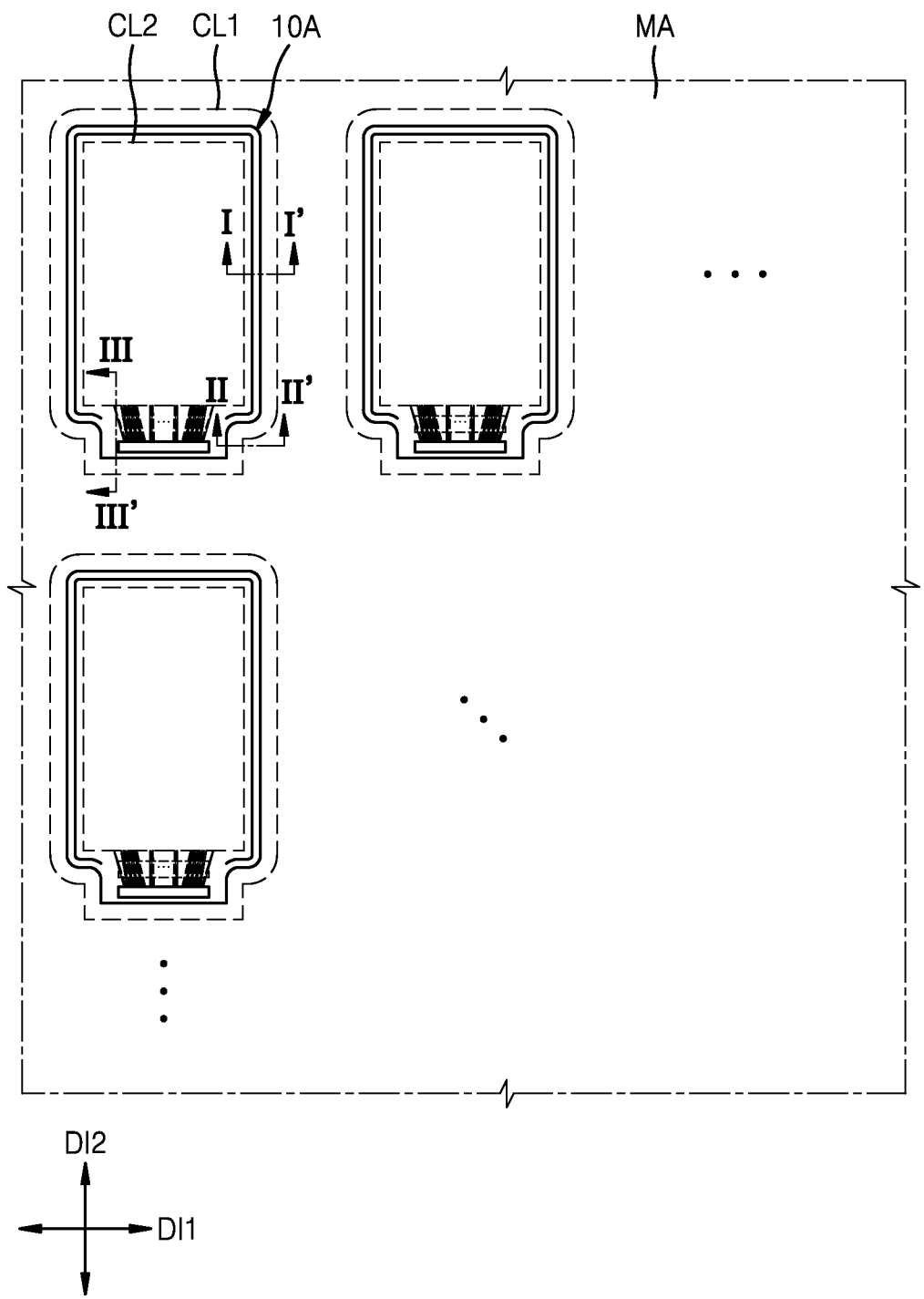
FIG. 3 is a plan view illustrating a method of manufacturing the display panel shown in FIG. 2 according to an embodiment.
Figure 4:
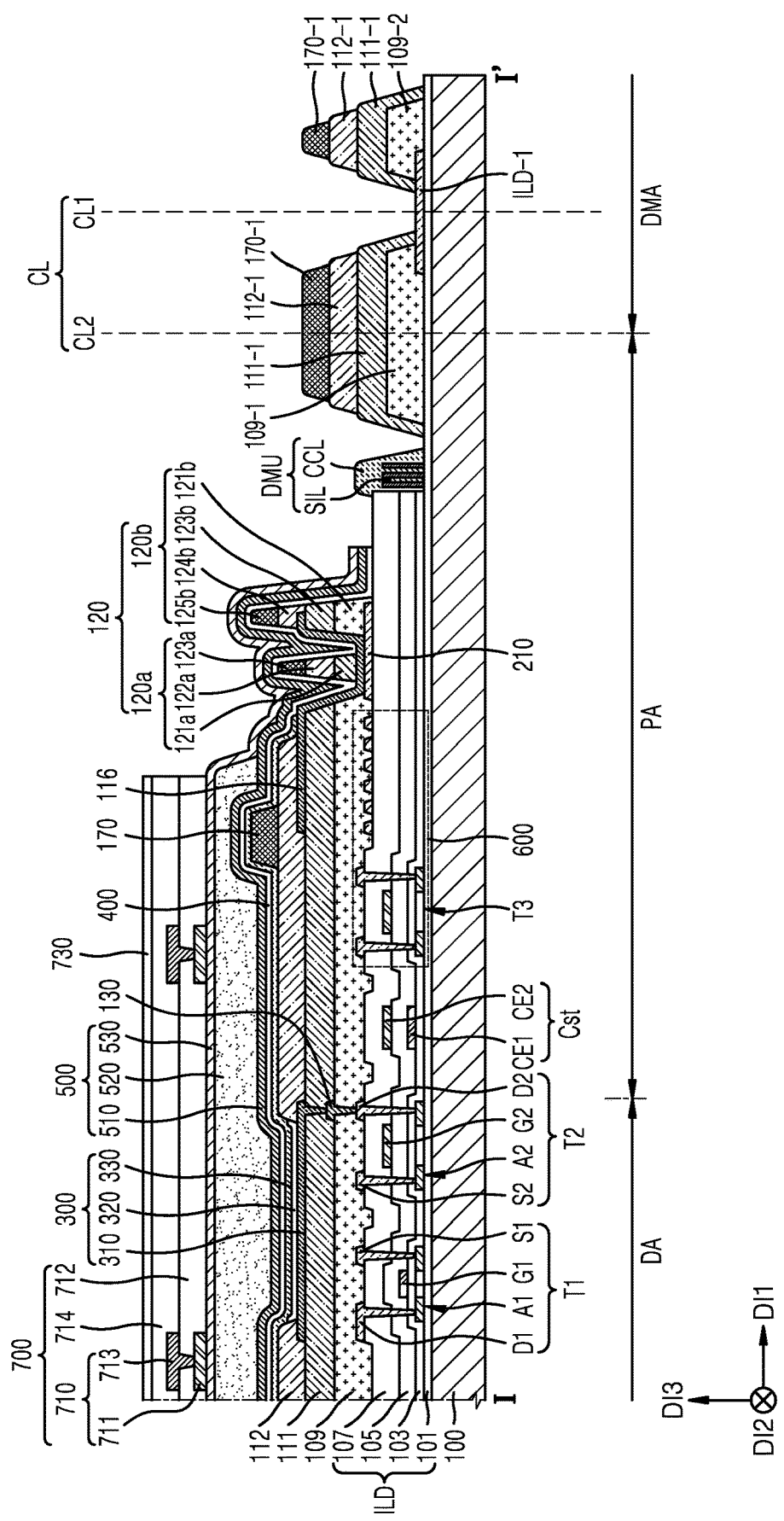
FIG. 4, FIG. 5, and FIG. 6 are cross-sectional views illustrating a method of manufacturing a display panel according to one or more embodiments.
Figure 5:
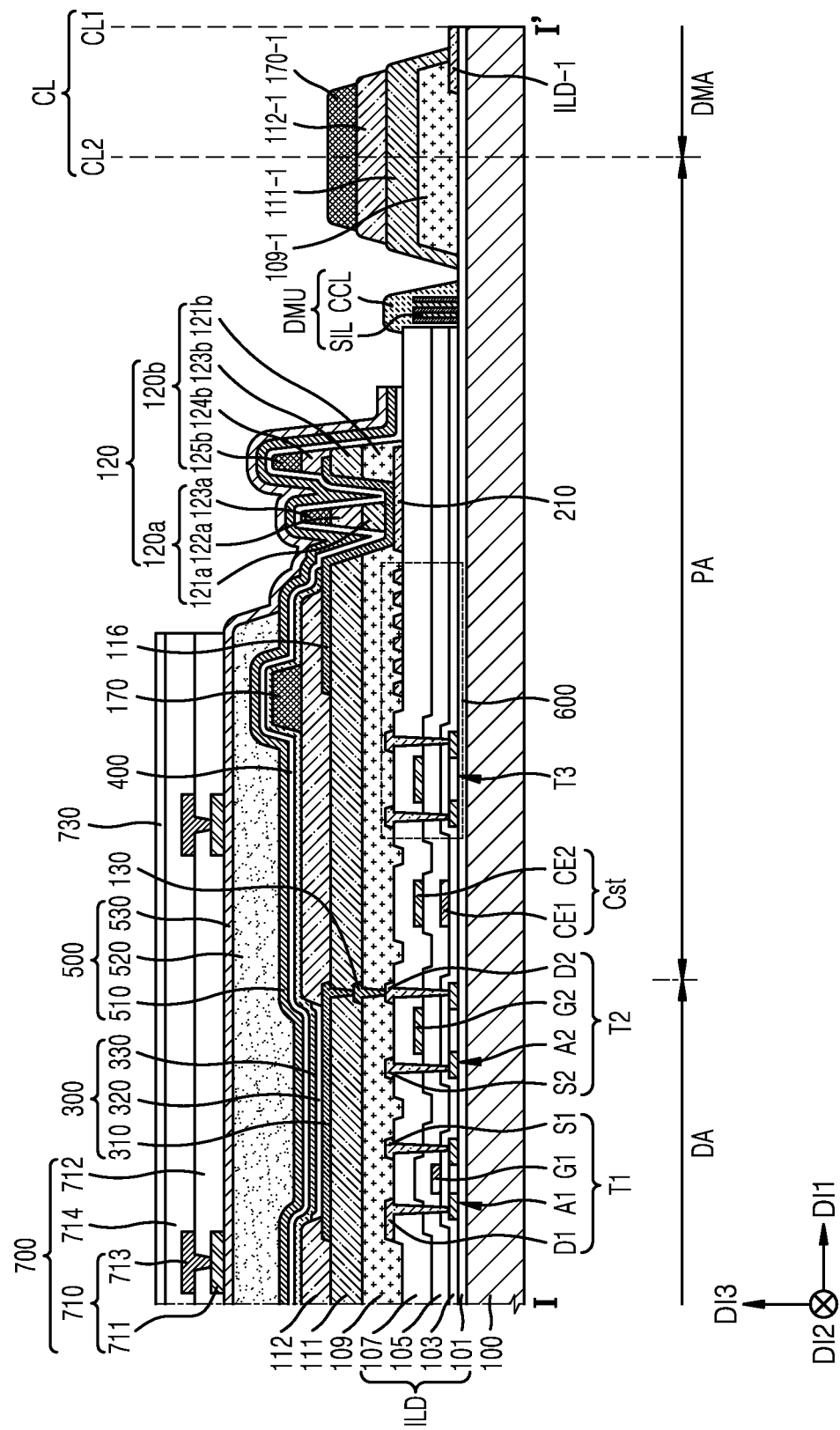
Figure 6:
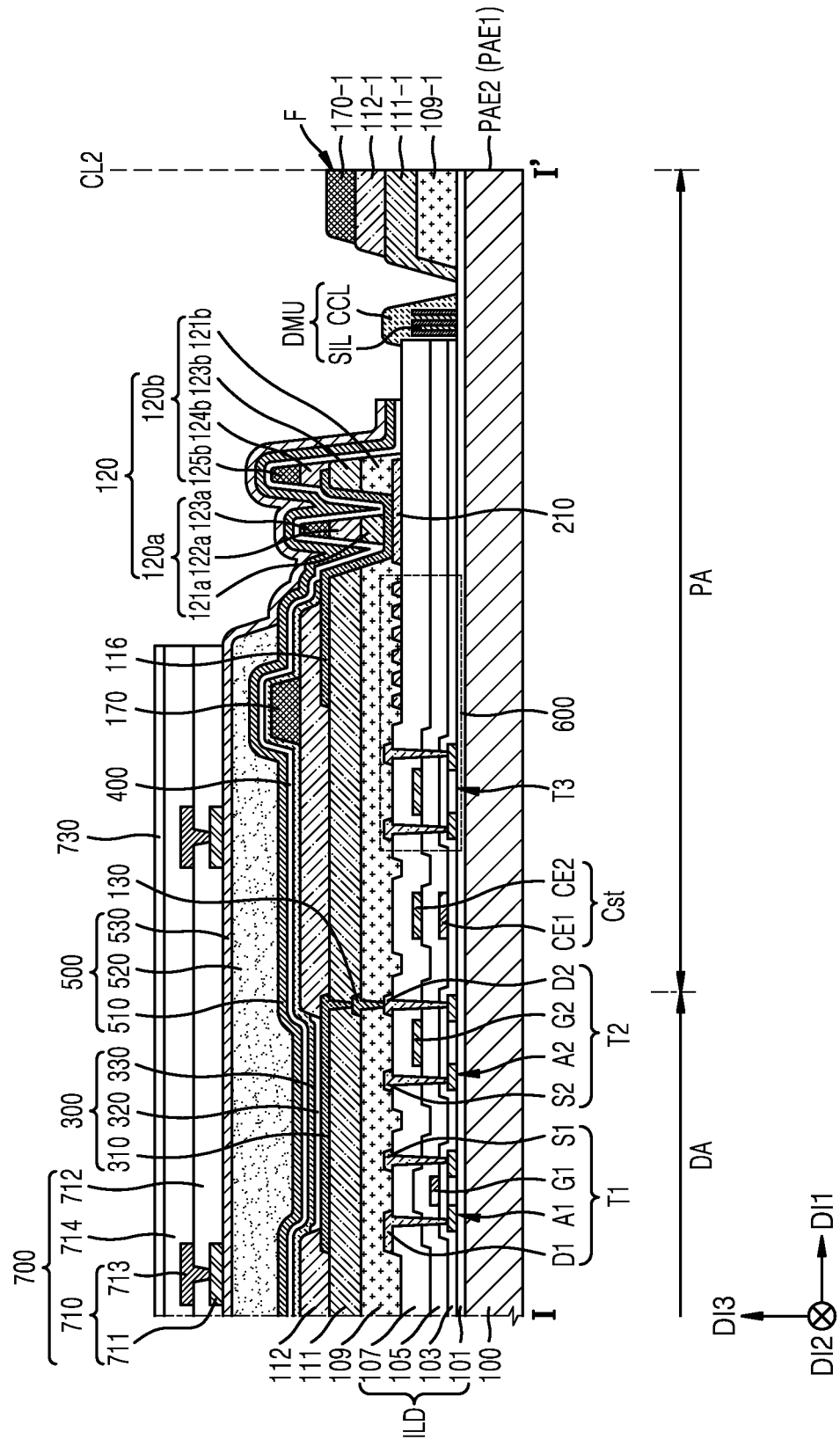

FIG. 3 is a plan view illustrating a method of manufacturing the display panel 10A of FIG. 2 according to an embodiment. FIGS. 4 to 6 are cross-sectional views illustrating a method of manufacturing a display panel according to one or more embodiments.

Referring to FIGS. 3 to 6, the display device 1 may be manufactured by manufacturing the display panel 10A and then combining the display panel 10A with the connection film CFM. Display panels 10A may be manufactured by forming layers on one base material MA or stacking layers in at least two areas of the base material MA spaced apart from each other, and then separating the base material MA.

Subsequently, the display panels 10A may be separated from one or more portions of the base material MA. A first cutting line CL1 may be first formed around each of the display panels 10A to separate the display panel 10A from the base material MA. A first cutting line CL1 may form a closed loop surrounding a corresponding one of the display panels 10A. The display panel 10A may include a dummy portion DMA. At least part of the dummy portion DMA may be arranged between the first cutting line CL1 and a second cutting line CL2. Referring to FIG. 4, the dummy portion DMA may range from the second cutting line CL2 to the first cutting line CL1 and may extend beyond the first cutting line CL1. When the first cutting line CL1 is formed or when portions of the base material MA are separated from the display panel 10A through the first cutting line CL1, the dummy portion DMA may prevent cracks occurring on the first cutting line CL1 side from extending into the display panel 10A.

There may be various ways to separate the display panel 10A from portions of the base material MA along the first cutting line CL1. The first cutting line CL1 may be positioned along a groove that is formed along the first cutting line CL1 on a surface of the display panel 10A and may be marked by a wheel-shaped blade. Subsequently, a physical force may be applied to the first cutting line CL1 through an instrument, such as a blade, to separate the display panel 10A including the dummy portion DMA from portions of the base material MA. Alternative to or in addition to a blade, a laser beam may be radiated onto the display panel 10A along the first cutting line CL1 to separate the display panel 10A from portions of the base material MA.

After separating the display panel 10A including the dummy portion DMA from portions of the base material MA, a physical force may be applied and/or a laser beam may be radiated to the second cutting line CL2 to completely remove the dummy portion DMA from the display panel 10A. A groove corresponding to the second cutting line CL2 may be formed simultaneously with the groove corresponding to the first cutting line CL1 or may be formed after the display panel 10A is separated from portions of the base material MA.

The display panel 10A produced by removing the dummy portion DMA may be bent as shown in FIG. 2. The display panel 10A may be bent after being connected to the connection film CFM, or may be connected to the connection film CFM after being bent.

The display panel 10A may include the substrate 100, an inorganic insulating layer ILD, organic insulating layers 109, 111, and 112, thin-film transistors T1 and T2, an organic light-emitting device 300, an encapsulation layer 500, a touch screen layer 700, a partition wall 120, the crack blocking unit DMU, and an edge protection unit (including at least one of elements 109-1, 111-1, etc.).

The substrate 100 may include the display area DA and the peripheral area PA outside the display area DA.

Pixels may be arranged in the display area DA of the substrate 100 for displaying images. A pixel may include an organic light-emitting device (OLED) 300, a thin-film transistor, a capacitor, etc. that are electrically connected. A driving current may pass through the display element according to a gate signal, a data signal, a driving voltage ELVDD, and a common voltage ELVSS provided to the pixel, and the display element may emit light having a luminance corresponding to the driving current.

The peripheral area PA may be arranged outside the display area DA. A line unit for transmitting signals and/or power to the display area DA may be arranged in/on the peripheral area PA. The line unit may include a drive circuit. The drive circuit may include at least one of a scan drive circuit (not indicated), a terminal unit (not shown), a driving power supply line (not shown), and a second line 210. The drive circuit may include a thin-film transistor T3 for controlling an electrical signal transmitted into the display area DA. The partition wall 120, a trench, and/or the like for blocking a flow of an organic film used to manufacture a display panel may be arranged in the peripheral area PA. At least one of the scan drive circuit, the terminal unit, the driving power supply line, the second line 210, and the thin-film transistor T3 may be arranged in/on part of the peripheral area PA arranged on a long side of the display panel 10A or on a short side of the display panel 10A.

The encapsulation layer 500 may encapsulate the display area DA and part of the peripheral area PA.

The substrate 100 may include one or more of various materials. The substrate 100 may include a transparent glass material with a silicon oxide ($SiO_x$) as a main component. The substrate 100 may include a transparent plastic material. The plastic material may include an insulating organic material, such as at least one of polyethersulphone (PES), polyacrylate (PAR), polyetherimide (PEI), polyethylene naphthalate (PEN), polyethyelene terephthalate (PET), polyphenylene sulfide (PPS), polyarylate, polyimide, polycarbonate (PC), cellulose triacetate (TAC), and cellulose acetate propionate (CAP). The substrate 100 may have a multi-layered structure including a layer including a plastic material and an inorganic layer (not shown).

A buffer layer 101 may be located on the substrate 100 so as to reduce or block penetration of foreign substances, moisture, or ambient air entering from (a lower portion of) the substrate 100, and may provide a flat surface on the substrate 100. The buffer layer 101 may include an inorganic material (such as oxide or nitride), an organic material, or an organic and inorganic compound, and may have a single-layered or multi-layered structure of an inorganic material and an organic material.

A first thin-film transistor T1 may include a semiconductor layer A1, a first gate electrode G1, a source electrode S1, and a drain electrode D1 A second thin-film transistor T2 may include a semiconductor layer A2, a second gate electrode G2, a source electrode S2, and a drain electrode D2.

Two thin-film transistors, i.e., the first and second transistors T1 and T2, may be provided. A display panel may include two or more thin-film transistors for each pixel. Six or seven thin-film transistors may be used for one pixel.

The semiconductor layers A1 and A2 may include amorphous silicon or polycrystalline silicon. Each of the semiconductor layers A1 and A2 may include oxide of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). Each of the semiconductor layers A1 and A2 may include a channel area and may include a source area and a drain area each having a greater carrier concentration than the channel area.

The first gate electrode G1 may be arranged on the semiconductor layer A1 with an intervening first gate insulating layer 103. The first gate electrode G1 may include at least one of molybdenum (Mo), aluminum (Al), copper (Cu), and Ti, and may include a single layer or multiple layers. As an example, the first gate electrode G1 may include a single Mo layer.

The inorganic insulating layer ILD may include at least one of a barrier layer (not shown), the buffer layer 101, the first gate insulating layer 103, and a second gate insulating layer 105, and an interlayer insulating layer 107.

The first gate insulating layer 103 is for insulating the semiconductor layer A1 from the first gate insulating layer 103 and may include at least one of $SiO_x$, silicon nitride ($SiN_x$), silicon oxynitride (SiON), aluminum oxide ($Al_2O_3$), and titanium oxide ($TiO_2$), tantalum oxide ($Ta_2O_5$), hafnium oxide ($HfO_2$), and zinc oxide (ZnO).

The second gate electrode G2 may be arranged on the semiconductor layer A2 with the first gate insulating layer 103 and the second gate insulating layer 105 being positioned between the elements G2 and A2. The second gate electrode G2 may include a conductive material including Mo, Al, Cu, Ti, or the like, and may include a single layer or multiple layers including some of the aforementioned conductive materials. The second gate electrode G2 may be a single Mo layer, or may include multiple layers including a Mo layer, an Al layer, and another Mo layer.

The second gate insulating layer 105 may include an inorganic material including oxide or nitride. The second gate insulating layer 105 may include $SiO_x$, $SiN_x$, SiON, $Al_2O_3$, $TiO_2$, $Ta_2O_5$, $HfO_2$, ZnO, or the like.

The source electrodes S1 and S2 and the drain electrodes D1 and D2 may be arranged on the interlayer insulating layer 107. Each of the source electrodes S1 and S2 and the drain electrodes D1 and D2 may include a conductive material including Mo, Al, Cu, Ti, or the like, and may include multiple layers or a single layer including one or more of the aforementioned conductive materials. For example, each of the source electrodes S1 and S2 and the drain electrodes D1 and D2 may include multiple layers of a Ti layer, an Al layer, and another Ti layer.

The interlayer insulating layer 107 may include $SiO_x$, $SiN_x$, SiON, $Al_2O_3$, $TiO_2$, $Ta_2O_5$, $HfO_2$, ZnO, or the like.

The first gate electrode G1 of the first thin-film transistor T1 and the second gate electrode G2 of the second thin-film transistor T2 may be arranged directly on different insulating layers. Accordingly, the driving ranges of the first thin-film transistor T1 and the second thin-film transistor T2 may be different from each other.

A first electrode CE1 of a storage capacitor Cst and the first gate electrode G1 may be arranged directly on a same insulating layer and may include a same material. A second electrode CE2 of the storage capacitor Cst may overlap the first electrode CE1 with the second gate insulating layer 105 between the electrodes CE1 and CE2. The second electrode CE2 and the second gate electrode G2 may be arranged directly on a same insulating layer and may include a same material.

FIG. 4 shows that the storage capacitor Cst does not overlap the first thin-film transistor T1 and the second thin-film transistor T2. The storage capacitor Cst may overlap the first thin-film transistor T1. The first electrode CE1 of the storage capacitor Cst may integrally formed with the first gate electrode G1. The first gate electrode G1 of the first thin-film transistor T1 may serve as the first electrode CE1 of the storage capacitor Cst.

An organic insulating layer may include planarization layers 109 and 111 and a pixel-defining layer 112. The organic insulating layer may include at least one of a spacer 170 and an organic material layer.

The planarization layers 109 and 111 may be located on the source electrodes S1 and S2 and the drain electrodes D1 and D2, and an organic light-emitting device (OLED) may be located on the planarization layers 109 and 111. In the planarization layers 109 and 111, a film including at least an organic material may include a single layer or multiple layers. The organic material may include a commercial polymer, such as at least one of poly(methyl methacrylate) (PMMA) or polystyrene (PS), a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, and a blend of some of the above polymers. The planarization layers 109 and 111 may include a composite laminate of an inorganic insulating film and an organic insulating film.

An organic light-emitting device 300 may be arranged on the second planarization layer 111 within the display area DA of the substrate 100. The organic light-emitting device 300 may include a pixel electrode 310, an opposite electrode 330, and an intermediate layer 320 located between the electrodes 310 and 330.

The pixel electrode 310 may be electrically connected to the first thin-film transistor T1 or the second thin-film transistor T2.

The pixel electrode 310 may be electrically connected to the second thin-film transistor T2 by contacting one of the source electrode S2 or the drain electrode D2 of the second thin-film transistor T2 via an opening formed in the first and second planarization layers 109 and 111. The pixel electrode 310 may be electrically connected to the drain electrode D2 of the second thin-film transistor T2. The pixel electrode 310 may be connected to the drain electrode D2 of the second thin-film transistor T2 via a connection electrode 130. The connection electrode 130 may be arranged on the first planarization layer 109. The connection electrode 130 may include a conductive material including Mo, Al, Cu, Ti, or the like, and may include a single layer or multiple layers. When each of the first and second planarization layers 109 and 111 includes multiple layers, a contact metal layer connecting the connection electrode 130 to the pixel electrode 310 may be included. A contact metal layer may include multiple layers having a structure in which a Ti layer, an Al layer, and another Ti layer are sequentially stacked. Where the each of the first and second planarization layers 109 and 111 includes a single layer, the contact metal layer may be optional.

The pixel electrode 310 may be a reflective electrode. The pixel electrode 310 may include a reflective film including at least one of silver (Ag), magnesium (Mg), Al, platinum (Pt), palladium (Pd), gold (Au), nickel (Ni), neodymium (Nd), iridium (Ir), chromium (Cr), and an alloy of some metals, and may include a transparent or semi-transparent electrode layer formed on the reflective film. The transparent or semi-transparent electrode layer may include at least one of indium tin oxide (ITO), indium zinc oxide (IZO), ZnO, $In_2O_3$, indium gallium oxide (IGO), and aluminum zinc oxide (AZO).

The pixel-defining layer 112 may be arranged on the second planarization layer 111. The pixel-defining layer 112 may include an opening corresponding to each of sub-pixels. The opening may expose at least a central portion of the corresponding pixel electrode 310. The pixel-defining layer 112 may prevent an arc from occurring at an edge of the pixel electrode 310 by increasing a distance between the edge of the pixel electrode 310 and the opposite electrode. The pixel-defining layer 112 may include an inorganic material, such as polyimide or hexamethyldisiloxane (HMDSO).

The spacer 170 may be arranged on the pixel-defining layer 112 and/or may be integrally formed with the pixel-defining layer 112. The spacer 170 may have one or more of various shapes. Spacers 170 may be of protrusions, and the spacers 170 may be spaced from each other on the pixel-defining layer 112. One spacer 170 may be provided between two immediately adjacent sub-pixels adjacent (or between two immediately adjacent intermediate layers 320). The spacers 170 may prevent mask sheets from adhering to the pixel-defining layer 112 and/or contacting the substrate 100, thus preventing potential defects in the substrate 100. The spacers 170 may not overlap the intermediate layers 320.

The spacers 170 may be simultaneously and integrally formed with the pixel-defining layer 112 when the pixel defining layer 112 is formed, or may be separately formed on the pixel-defining layer 112 after the pixel-defining layer 112 is formed. The spacer 170 and the pixel-defining layer 112 may include a same material or different materials.

The intermediate layer 320 of the organic light-emitting device 300 may include a low-molecular-weight or polymer material. The intermediate layer 320 may include a hole injection layer (HIL), a hole transport layer (HTL), an electron transport layer (ETL), and an electron injection layer (EIL) that are stacked. and the intermediate layer 320 may include one or more organic materials including copper phthalocyanine (CuPc), (N,N-Di(naphthalene-1-yl)-N,N'-diphenyl-benzidine (NPB), tris-8-hydroxyquinoline aluminum (Alq3), or the like. Layers of the intermediate layer 320 may be formed through vacuum deposition.

When the intermediate layer 320 includes a polymer material, the intermediate layer 320 may include a HTL and an EML. The HTL may include poly(3,4-ethylenedioxythiophene) (PEDOT), and the EML may include a polyphenylene vinylene (PPV)-based polymer material, a polyfluorene-based polymer material, or the like. The intermediate layer 320 may be formed through screen printing or inkjet printing, laser induced thermal imaging (LITI), vacuum deposition using a mask, or the like.

The intermediate layer 320 may include a layer that is integral over pixel electrodes 310. The intermediate layer 320 may include a patterned layer corresponding to the pixel electrodes 310.

The opposite electrode 330 may be arranged on the display area DA. The opposite electrode 330 may cover the display area DA. The opposite electrode 330 may correspond to (all or many of) the pixel electrodes 310. The opposite electrode 330 may substantially cover the display area DA and may cover a portion of part of the peripheral area PA.

The opposite electrode 330 may be a light-transmitting electrode. The opposite electrode 330 may be a transparent or semi-transparent electrode, and may include a metal thin film having a low work function including at least one of lithium (Li), calcium (Ca), lithium fluoride/Ca (LiF/Ca), LiF/Al, Al, Ag, Mg, and an alloy of some of the metals. A transparent conductive oxide (TCO) film including ITO, IZO, ZnO, $In_2O_3$, or the like may be arranged on the metal thin film.

As the pixel electrode 310 is a reflective electrode and the opposite electrode 330 is a light-transmitting electrode, the display device may be an all-surface emission type display device in which light emitted from the intermediate layer 320 is emitted toward the opposite electrode 330. The display device may be a rear-surface emission type display device in which light emitted from the intermediate layer 320 is emitted toward the substrate 100. The pixel electrode 310 may include a transparent or semi-transparent electrode, and the opposite electrode 330 may include a reflective electrode. The display device may be a bilateral emission type display panel in which light is emitted in through both a front surface and a rear surface.

A capping layer 400 may be arranged on the opposite electrode 330. The capping layer 400 may directly contact the opposite electrode 330. The capping layer 400 may have a refractive index that is less than that of the opposite electrode 330 and greater than that of a first inorganic encapsulation layer. The capping layer 400 may improve the light efficiency by reducing a rate at which light generated in the intermediate layer 320 including the organic emission layer is totally reflected and is not emitted to the outside.

The capping layer 400 may include an inorganic material. The inorganic material may include at least one of ZnO, $TiO_2$, zirconium oxide, $SiN_x$, niobium oxide, $Ta_2O_5$, tin oxide, nickel oxide, indium nitride, and gallium nitride.

The capping layer 400 may have a refractive index that is greater than that of the first inorganic encapsulation layer 510. The refractive index of the capping layer 400 may be greater than the refractive index of the first inorganic encapsulation layer 510 by about 0.24 or more. When a difference between the refractive index of the capping layer 400 and the refractive index of the first inorganic encapsulation layer 510 is less than about 0.24, too much total reflection may occur on a boundary of the capping layer 400, or light corresponding to a resonance frequency of the emission layer may not pass, such that the luminance may decrease. The refractive index of the capping layer 400 may be about 1.8 or more. When the refractive index of the capping layer 400 is less than about 1.8, light may be reflected between the first inorganic encapsulation layer 510 and the capping layer 400, such that the luminance of the emission layer may decrease.

The thickness of the capping layer 400 may be about 1000 Å (angstroms) or less. The thickness of the capping layer 400 may be measured in a third direction DI3 of FIG. 4. If the thickness of the capping layer 400 exceeds about 1000 Å, a large amount of time and energy may be consumed when the capping layer 400 is formed. If the thickness of the capping layer 400 exceeds about 1000 Å, light emitted from the emission layer may not pass through the capping layer 400 or a wavelength may be variable, such that implementing a clear image may be difficult.

The encapsulation layer 500 may cover a portion of the display area and the peripheral area PA, such that penetration of external moisture and oxygen may be prevented. The encapsulation layer 500 may include at least one organic encapsulation layer and at least one inorganic encapsulation layer. In FIG. 4, the encapsulation layer 500 includes two inorganic encapsulation layers 510 and 530 and one organic encapsulation layer 520.

The first inorganic encapsulation layer 510 may cover the opposite electrode 330, and may include $SiO_x$, $SiN_x$, SiON, and/or the like. Other layers, such as the capping layer 400 or the like, may be located between the first inorganic encapsulation layer 510 and the opposite electrode 330 as needed. The first inorganic encapsulation layer 510 may be formed along an underlying structure, such that an upper surface of the first inorganic encapsulation layer 510 may not be flat. An organic encapsulation layer 520 may cover the first inorganic encapsulation layer 510, and an upper surface of the organic encapsulation layer 520 may be substantially flat in the display area DA. The organic encapsulation layer 520 may include at least one of PET, PEN, PC, polyimide, polyethylene sulfonate, polyoxymethylene, polyarylate, and HMDSO. A second inorganic encapsulation layer 530 may cover the organic encapsulation layer 520 and may include $SiO_x$, $SiN_x$, SiON, and/or the like.

The encapsulation layer 500 may include the first inorganic encapsulation layer 510, the organic encapsulation layer 520, and the second inorganic encapsulation layer 530. Thus, even if a crack occurs within the encapsulation layer 500, the crack may not be connected between the first inorganic encapsulation layer 510 and the organic encapsulation layer 520 or between the organic encapsulation layer 520 and the second inorganic encapsulation layer 530. Therefore, potential paths through which external moisture, oxygen, or the like penetrates into the display area DA and the peripheral area PA may be prevented or minimized. The second inorganic encapsulation layer 530 may contact the first inorganic encapsulation layer 510 at an edge of the second inorganic encapsulation layer 530 located outside the display area DA so that the organic encapsulation layer 520 may not be exposed.

On the partition wall 120, the first inorganic encapsulation layer 510 may directly contact the capping layer 400. The capping layer 400, the first inorganic encapsulation layer 510, and the second inorganic encapsulation layer 530 may be sequentially stacked on the partition wall 120.

A first line 116 may be formed directly on a same insulating layer on which the pixel electrode 310 is formed. The first line 116 may be arranged directly on a flat surface of the second planarization layer 111 and directly on the partition wall 120, as shown in FIG. 4. The first line 116 and the pixel electrode 310 may be formed simultaneously and may include a same material. The first line 116 may electrically connected the opposite electrode 330 to the second line 210. The first line 116 may stably provide a common voltage ELVSS to the opposite electrode 330 through a sufficient area of contact with the opposite electrode 330. At least a portion of the first line 116 may shield all or part of the second line 210. The first line 116 may shield an entire surface of the second line 210, and may extend on some layers of the partition wall 120.

The second line 210 and a cladding layer CCL may be arranged in/on the peripheral area PA of the substrate 100. The second line 210 may supply power to the display area DA, and may be arranged directly on a same insulating layer on which the source electrodes S1 and S2 and the drain electrodes D1 and D2 are arranged. The second line 210 may include a same material as the source electrodes S1 and S2 and the drain electrodes D1 and D2. The second line 210 may be connected to the opposite electrode 330 of the organic light-emitting device 300 and may serve transmit the common voltage ELVSS. The second line 210 may be directly connected to the opposite electrode 330. The second line 210 may be connected to the opposite electrode 330 through the first line 116. The first line 116 and the pixel electrode 310 may be formed at a same time and may include a same material.

The partition wall 120 may cover at least a portion of the second line 210. The partition wall 120 may cover an edge of the second line 210 far from the display area DA, and may not cover an edge of the second line 210 close to the display area DA. The partition wall 120 may cover the entire second line 210.

When forming the organic encapsulation layer 520 of the encapsulation layer 500 to encapsulate the display area DA and the peripheral area PA, the partition wall 120 may block a flow of an organic material toward an edge of the substrate 100, thereby preventing an edge tail from being formed in the organic encapsulation layer 520.

At least one partition wall 120 may be provided.

The partition walls 120 may include a first partition wall 120*a* and a second partition wall 120*b* that are spaced from each other.

The first partition wall 120*a* and the second partition wall 120*b* may be arranged on the second line 210 in the peripheral area PA, and at least one of the first partition wall 120*a* and the second partition wall 120*b* may cover an edge of the second line 210. At least one of the first partition wall 120*a* and the second partition wall 120*b* may include multiple layers. In FIG. 4, the first partition wall 120*a* has a stacked structure of a first layer 121*a* (including a same material as the second planarization layer 111), a second layer 122*a* (including a same material as the pixel-defining layer 112), and a third layer 123*a* (including a same material as the spacer 170); the second partition wall 120*b* has a stacked structure of a first layer 121*b* (including a same material as the first planarization layer 109), a second layer 123*b* (including a same material as the second planarization layer 111), a third layer 124*b* (including a same material as the pixel-defining layer 112), and a fourth layer 125*b* (including a same material as the spacer 170). One of the first partition wall 120*a* and the second partition wall 120*b* may be a single layer, both of the first partition wall 120*a* and the second partition wall 120*b* may include a double-layered structure, or both of the first partition wall 120*a* and the second partition wall 120*b* may have a three-layered structure. The partition wall 120 may further include a third partition wall that is spaced apart from at least one of the first partition wall 120*a* and the second partition wall 120*b*.

Because the partition wall 120 includes multiple partition walls, potential overflow of an organic material when the organic encapsulation layer 520 is formed may be effectively prevented.

The first line 116 connected to the second line 210 may extend on a second layer 123*b* of the second partition wall 120*b*. Accordingly, an area of contact between the first line 116 and the second line 210 may be maximized, such that a contact resistance of the second line 210 and the first line 116 may be minimized.

The crack blocking unit DMU may include the cladding layer CCL and a slit SIL. The cladding layer CCL may be formed on the substrate 100 and may include/contain the slit SIL. The cladding layer CCL may be formed on the buffer layer 101 on the substrate 100.

The cladding layer CCL may have a width that is greater than that of the slit SIL, and may have a length that is greater than that of the slit SIL. The cladding layer CCL may completely cover (or contain) the slit SIL so that the slit SIL is not exposed.

The cladding layer CCL may include an inorganic material and/or an organic material.

The cladding layer CCL may include an organic material. Therefore, an appropriate thickness and width of the cladding layer CCL may be easily secured, such that the slit SIL may be effectively covered.

The cladding layer CCL may include a same material as an organic insulating layer formed in the peripheral area PA of the substrate 100. The cladding layer CCL may be formed simultaneously with an organic insulating layer formed in the display area DA. The cladding layer CCL may include a same material as the at least one of the first planarization layer 109, the second planarization layer 111, the spacer 170, and the pixel-defining layer 112.

The cladding layer CCL may be formed in the peripheral area PA.

The cladding layer CCL may be arranged on an edge of the substrate 100 or between a cutting line CL2/CL1 and the display area DA.

The cladding layer CCL may have an elongated shape. Referring to FIG. 1 and FIG. 3, the cladding layer CCL may be elongated parallel to the cutting line CL2/CL1 of the substrate 100 (or a long side or a short side of the substrate 100). A length of the cladding layer CCL may be less than or greater than a length of the display area DA.

The slit SIL may be provided in the peripheral area PA of the display panel 10A. The slit SIL may be formed by removing part of at least one of an inorganic layer and an organic layer. The slit SIL may block cracks propagating from an edge of the substrate 100. The slit SIL adjacent to the cutting line CL of the substrate 100 may primarily prevent the propagation of cracks that may occur on the substrate 100 when the individual display panel 10A is cut and separated from (portions of) a mother substrate.

The slit SIL may be formed on the buffer layer 101. The buffer layer 101 on the substrate 100 may be formed in the peripheral area PA and may extend to the cutting line CL, such that an upper surface of the substrate 100 may be protected. The slit SIL may block or reduce cracks that may occur in the buffer layer 101 (due to pressure applied to the buffer layer 101). The slit SIL may block the propagation of cracks.

The cladding layer CCL may be formed on the slit SIL. The movement of foreign substances or particles that may be formed on the slit SIL may be prevented through the cladding layer CCL. The cladding layer CCL may cover the slit SIL so as not to expose foreign substances or particles remaining in the slit SIL.

When the display panel 10A is formed, foreign substances or particles may be generated in the slit SIL. A conductive material that is used to form an electrode during a process of forming the display panel 10A may remain in the slit SIL. The conductive material remaining in the slit SIL may cause defects of the display panel 10A in a subsequent process. The remaining conductive material may move to the display area DA and cause electrical defects of the display panel 10A, and may deteriorate electrical characteristic and image quality characteristic of the display panel 10A.

The cladding layer CCL may be formed on the slit SIL and may block a movement of the remaining foreign substances and particles, for minimizing defects that may occur in the display area DA or the like.

The exfoliation of the cladding layer CCL from the substrate 100 due to the slit SIL may be prevented.

The touch screen layer 700 may include a first touch conductive layer 711, a first insulating layer 712, a second touch conductive layer 713, and a second insulating layer 714 that are stacked in sequence. A touch electrode 710 may include the first touch conductive layer 711 and the second touch conductive layer 713.

The second touch conductive layer 713 may serve as a sensing unit for sensing whether a contact is made, and the first touch conductive layer 711 may serve as a connection unit connecting the patterned second touch conductive layer 713 in one direction.

Each of the first touch conductive layer 711 and the second touch conductive layer 713 may serve as a sensing unit. The first insulating layer 712 may include a via-hole exposing an upper surface of the first touch conductive layer 711, and the first touch conductive layer 711 and the second touch conductive layer 713 may be connected to each other through the via-hole. Through the use of the first touch conductive layer 711 and the second touch conductive layer 713, a resistance of the touch electrode 710 may decrease, such that a response speed of the touch screen layer 700 may increase.

The touch electrode 710 may be formed in a mesh structure so that light emitted from the organic light-emitting device 300 may penetrate through. The first touch conductive layer 711 and the second touch conductive layer 713 of the touch electrode 710 may not overlap an emission area of the organic light-emitting device 300.

Each of the first touch conductive layer 711 and the second touch conductive layer 713 may include a single film or multiple films including a conductive material having a good conductivity. The first touch conductive layer 711 may be a transparent conductive layer, and the second touch conductive layer 713 may include a single film or multiple films including a conductive material including Al, Cu, Ti, and/or the like. The transparent conductive layer may include transparent conductive oxide such as ITO, IZO, ZnO, indium tin zinc oxide (ITZO), or the like. The transparent conductive material may include a conductive polymer such as PEDOT, a metal nanowire, graphene, or the like. Each of the first touch conductive layer 711 and the second touch conductive layer 713 may have a stacked structure of a Ti layer, an Al layer, and another Ti layer.

Each of the first insulating layer 712 and the second insulating layer 714 may include an inorganic material or an organic material. The inorganic material may be at least one of $SiN_x$, aluminum nitride, zirconium nitride, titanium nitride, hafnium nitride, tantalum nitride, $SiO_2$, aluminum oxide, $TiO_2$, tin oxide, cerium oxide, and SiON. The organic material may be at least one of acryl-based resin, methacryl-based resin, polyisoprene, vinyl-based resin, epoxy-based resin, urethane-based resin, cellulose-based resin, and perylene-based resin.

A touch buffer layer may be further provided between the encapsulation layer 500 and the touch screen layer 700. The touch buffer layer may prevent the damage of the encapsulation layer 500, and may block an interference signal that may be generated when the touch screen layer 700 is driven. The touch buffer layer may include an inorganic material such as $SiO_x$, $SiN_x$, SiON, $Al_2O_5$, aluminum nitride, $TiO_2$, or titanium nitride, or an organic material such as polyimide, polyester, acryl, or the like, and may include laminates of some of the above materials.

The touch buffer layer and/or the touch screen layer 700 may be directly formed on the encapsulation layer 500 by deposition, etc., without requiring an additional adhesive layer on the encapsulation layer 500. Thus, a thickness of the display device may be minimized.

A cover layer 730 may be flexible, and may include PMMA, polydimethylsiloxane, polyimide, acrylate, PET, PEN, or the like. The cover layer 730 may be arranged on the touch screen layer 700 and protect the touch screen layer 700. The cover layer 730 may extend to the peripheral area PA as shown in FIGS. 4 to 6. The cover layer 730 may be arranged only in the display area DA.

An edge protection unit may be arranged at an edge of the display panel 10A. An edge coinciding with (and/or corresponding to) the second cutting line CL2 and shown in one or more of FIGS. 4 to 6 may represent one or more of the first side/edge PAE1, the second side/edge PAE2, and the third side/edge PAE3 of the display panel 10A shown in FIG. 1. The edge protection unit may include at least one the organic insulating layer. The edge protection unit may include at least one of a first edge protection layer 109-1, a second edge protection layer 111-1, a third edge protection layer 112-1, and a fourth edge protection layer 170-1. The first edge protection layer 109-1 and the first planarization layer 109 may include a same material. The second edge protection layer 111-1 may include a same material as the second planarization layer 111 or the organic material layer 160 (shown in FIG. 11). The third edge protection layer 112-1 and the pixel-defining layer 112 may include a same material. The fourth edge protection layer 170-1 and the spacer 170 may include a same material.

Edge protection units may be spaced from each other. One of the edge protection units may be arranged on the dummy portion DMA, and another one of the edge protection units may be arranged at a boundary of the dummy portion DMA. One of the edge protection units may be arranged at an outer periphery beyond a second cutting line CL2, and another one of the edge protection units may be arranged on the second cutting line CL2. A first cutting line CL1 may be formed between the edge protection units that are adjacent to each other. The second cutting line CL2 may penetrate through a center of one of the edge protection units. Two halves of a cross section of an edge protection unit divided by the second cutting line CL2 are symmetrical (i.e., are mirror images) with respect to the second cutting line CL2.

At least one edge protection unit may substantially surround at least a portion of an inorganic insulating layer ILD-1 arranged on the dummy portion DMA. When the dummy portion DMA is removed, a crack occurring in the inorganic insulating layer ILD-1 may not affect the display panel 10A, and/or a crack occurring in the substrate 100 may not extend to the display panel 10A.

The display panel 10A may be separated from portions of the base material MA through removing the dummy portion DMA. In this case, in the display panel 10A, a right portion of the substrate 100 in FIG. 4 may be removed after the substrate 100 has been cut at the first cutting line CL1 arranged between the adjacent edge protection units. As shown in FIG. 5, the edge protection unit on the right shown in FIG. 4 has been removed. A portion of an inorganic insulating layer ILD-1 arranged in the dummy portion DMA may remain.

Subsequently, the structure shown in FIG. 5 may be cut at the second cutting line CL2, so as to completely remove the dummy portion DMA resulting in a face F of the remaining edge protection unit being coplanar with the side/edge PAE2 (PAE1) as shown in FIG. 6. Since the edge protection unit is partially removed along the second cutting line CL2, occurrences of cracks in the substrate 100 may be minimized. If no edge protection unit is arranged on the second cutting line CL2, a crack may occur when a physical force is directly applied to the substrate 100, and/or when a laser beam is directly irradiated onto the substrate 100, a heat deflection may occur in the second cutting line CL2, and the heat may be transferred to the display area DA through the substrate 100. The edge protection unit may concentrate the physical force and may absorb some of thermal energy, thereby mitigating the aforementioned problem.

Thus, when the substrate 100 is separated from portions of a base material along the first side PAE1, the second side PAE2, and the third side PAE3 of the display panel 10A, resulting in the display panel 10A shown in FIG. 6, the damage or breakage of the display panel 10A may be minimized or prevented.

Figure 7:
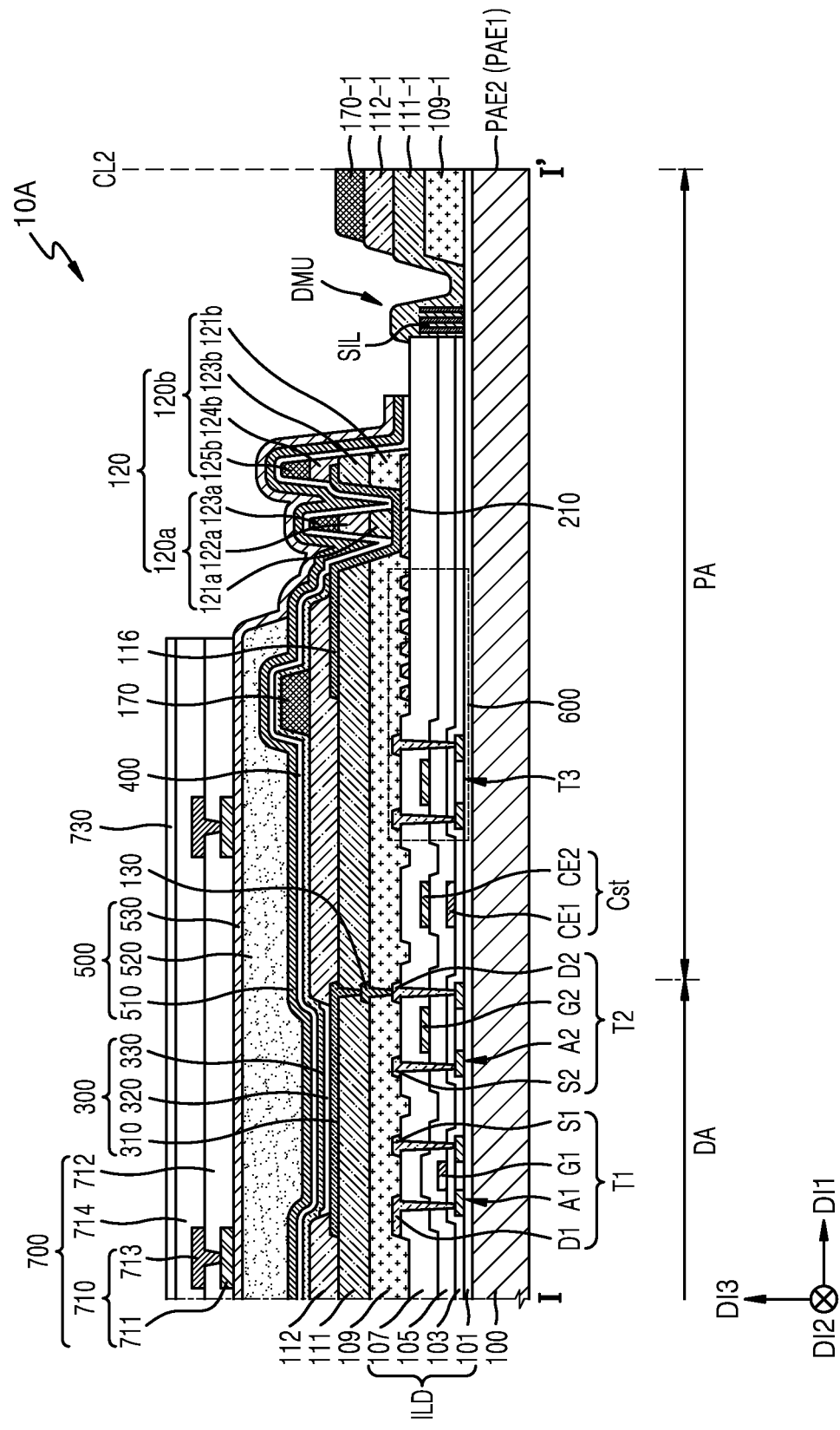
FIG. 7 is a cross-sectional view illustrating part of a display panel according to an embodiment.

FIG. 7 is a cross-sectional view illustrating part of a display panel 10A according to an embodiment.

Referring to FIG. 7, the display panel 10A may include the inorganic insulating layer ILD, the organic insulating layers 109, 111, 112, and 170, the thin-film transistors T1 and T2, the organic light-emitting device 300, the encapsulation layer 500, the touch screen layer 700, the partition wall 120, the crack blocking unit DMU, and the edge protection unit. The inorganic insulating layer ILD, the organic insulating layers 109, 111, 112, and 170, the thin-film transistors T1 and T2, the organic light-emitting device 300, the encapsulation layer 500, the touch screen layer 700, and the partition wall 120 may be identical or similar to those described with reference to FIGS. 4 and 6.

The crack blocking unit DMU may include at least one slit SIL. The cladding layer CCL with reference to FIGS. 3 to 6 may not be provided. One or more slits SL may be formed in an extension of the second edge protection layer 111-1 of the edge protection unit. The second edge protection layer 111-1 of the edge protection unit may extend from the edge protection unit to the inorganic insulating layer ILD and may include the slit(s) SL. The second edge protection layer 111-1 of the edge protection unit may include a valley arranged between the slit SIL and the first edge protection layer 109-1 of the edge protection unit.

The slit(s) SL may be shielded by the first edge protection layer 109-1 of the edge protection unit. The slit(s) SL may be shielded by both the first edge protection layer 109-1 and the second edge protection layer 111-1 of the edge protection unit. Thus, when a dummy portion is removed along the edge protection unit, damage to the substrate 100 and/or the display area DA may be minimized or prevented.

Figure 8:
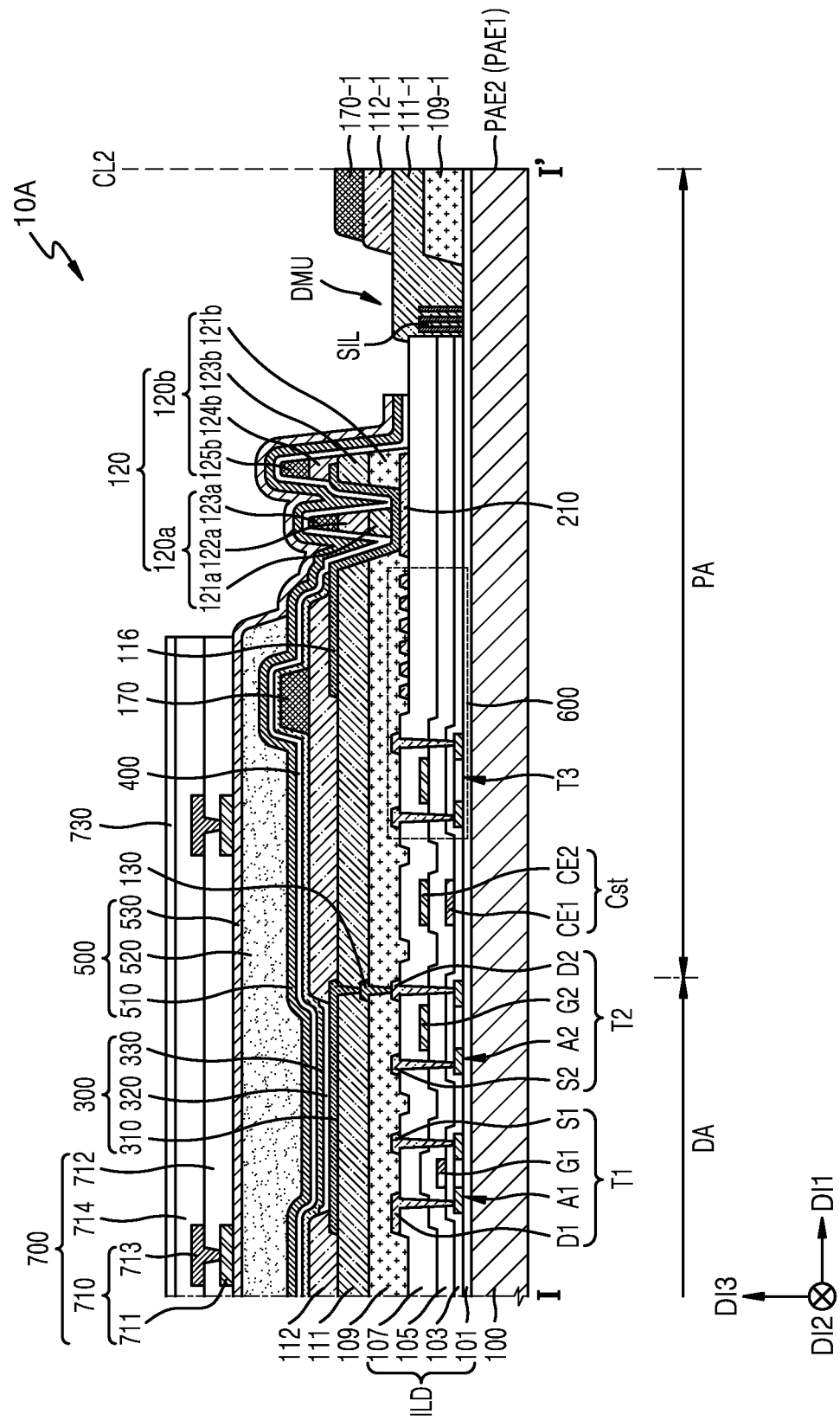
FIG. 8 is a cross-sectional view illustrating part of a display panel according to an embodiment.

FIG. 8 is a cross-sectional view illustrating part of a display panel 10A according to an embodiment.

Referring to FIG. 8, the display panel 10A may include the inorganic insulating layer ILD, the organic insulating layers 109, 111, 112, and 170, the thin-film transistors T1 and T2, the organic light-emitting device 300, the encapsulation layer 500, the touch screen layer 700, the partition wall 120, the crack blocking unit DMU, and the edge protection unit. The inorganic insulating layer ILD, the organic insulating layers 109, 111, 112, and 170, the thin-film transistors T1 and T2, the organic light-emitting device 300, the encapsulation layer 500, and the touch screen layer 700 may be identical or similar to those described above with reference to FIGS. 4 and 6.

The crack blocking unit DMU may include at least one slit SIL. The slit SIL may be substantially identical or similar to the slit SIL shown in one or more of FIGS. 4 to 7.

The edge protection unit may include at least one of the first edge protection layer 109-1, the second edge protection layer 111-1, the third edge protection layer 112-1, and the fourth edge protection layer 170-1.

At least one of the edge protection layers may include the slit SIL and may shield the inorganic insulating layer ILD arranged in the peripheral area PA. The second edge protection layer 111-1 may include the slit SIL. Unlike in FIG. 7, an upper surface of the second edge protection layer 111-1 may be substantially flat, and the second edge protection layer 111-1 may include no valley between the slit SIL and the first edge protection layer 109-1. Therefore, when cutting is performed along the second cutting line CL2, the transfer of impact toward the slit SIL may be substantially blocked by the second edge protection layer 111-1.

The display panel 10A may be manufactured using steps similar to or identical to those shown in FIGS. 3 to 6. The display panel 10A may be separated from portions of a base material through cutting along a first cutting line. A dummy portion DMA may be removed through cutting along the second cutting line CL2. The cutting along the second cutting line CL2 may penetrate through the edge protection unit.

When the dummy portion DMA is removed along the second cutting line CL2, the edge protection unit may reduce the damage to the substrate 100 and/or the display area DA.

Figure 9:
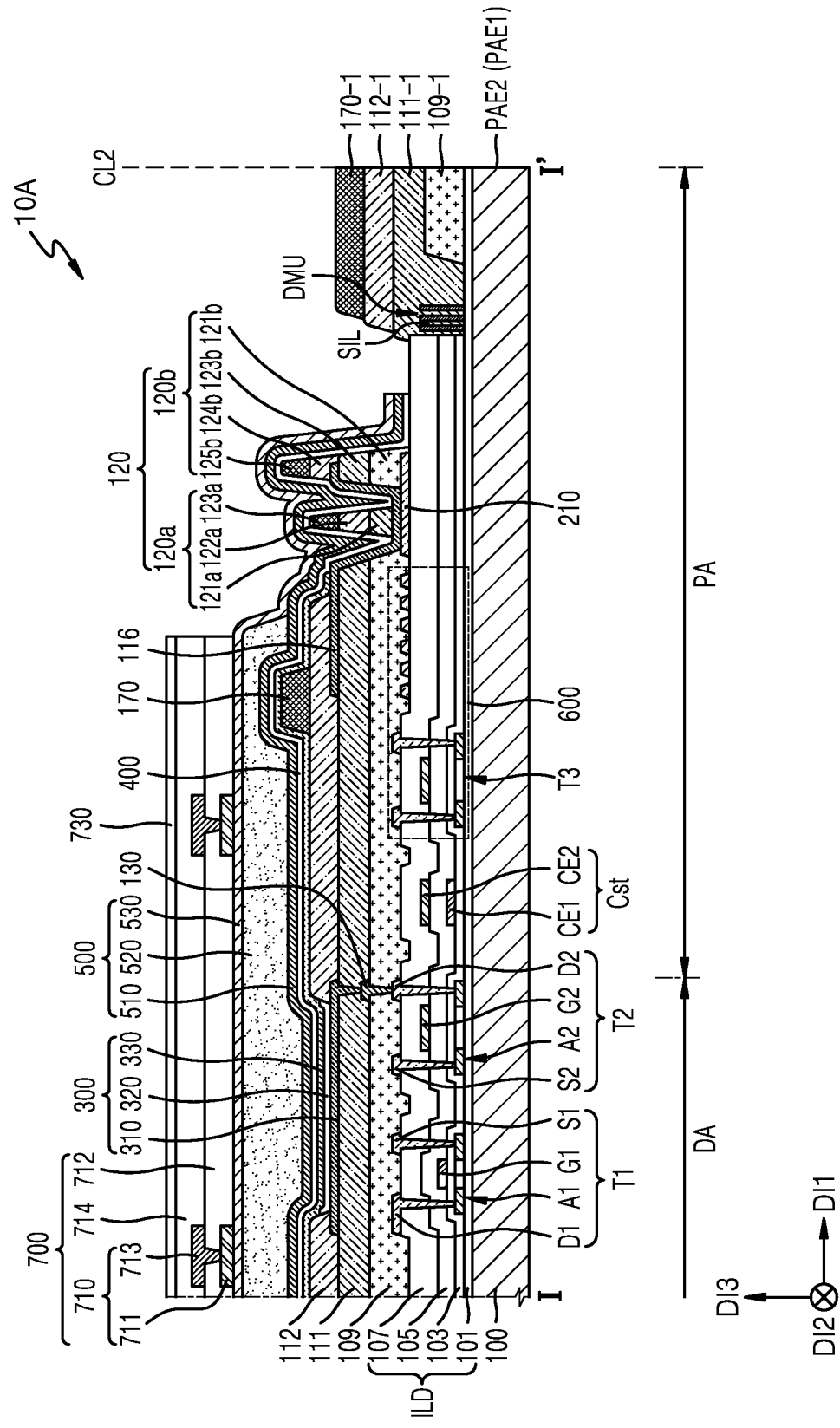
FIG. 9 is a cross-sectional view illustrating part of a display panel according to an embodiment.

FIG. 9 is a cross-sectional view illustrating part of a display panel 10A according to an embodiment.

Referring to FIG. 9, the display panel 10A may include the inorganic insulating layer ILD, the organic insulating layers 109, 111, 112, and 170, the thin-film transistors T1 and T2, the organic light-emitting device 300, the encapsulation layer 500, the touch screen layer 700, the partition wall 120, the crack blocking unit DMU, and the edge protection unit. The display panel 10A is similar to the display panel 10A shown in FIG. 8, such that differences will be described in detail.

The crack blocking unit DMU may include the slit SIL, and the second edge protection layer 111-1, the third edge protection layer 112-1, and the fourth edge protection layer 170-1 of the edge protection unit may be arranged on and may substantially cover the slit SIL. The second edge protection layer 111-1, the third edge protection layer 112-1, and the fourth edge protection layer 170-1 may each extend from an edge of the display panel 10A to the slit SIL. The edge protection unit may include the first edge protection layer 109-1, the second edge protection layer 111-1, the third edge protection layer 112-1, and the fourth edge protection layer 170-1.

In embodiments, only the second edge protection layer 111-1 and the third edge protection layer 112-1 may be arranged on the slit SIL, or only the second edge protection layer 111-1 and the fourth edge protection layer 170-1 may be arranged on the slit SIL.

Thus, when the dummy portion DMA is removed along the second cutting line CL2, the edge protection unit may effectively block impact, such that damage to the substrate 100 and/or the display area DA may be prevented or minimized.

Figure 10:
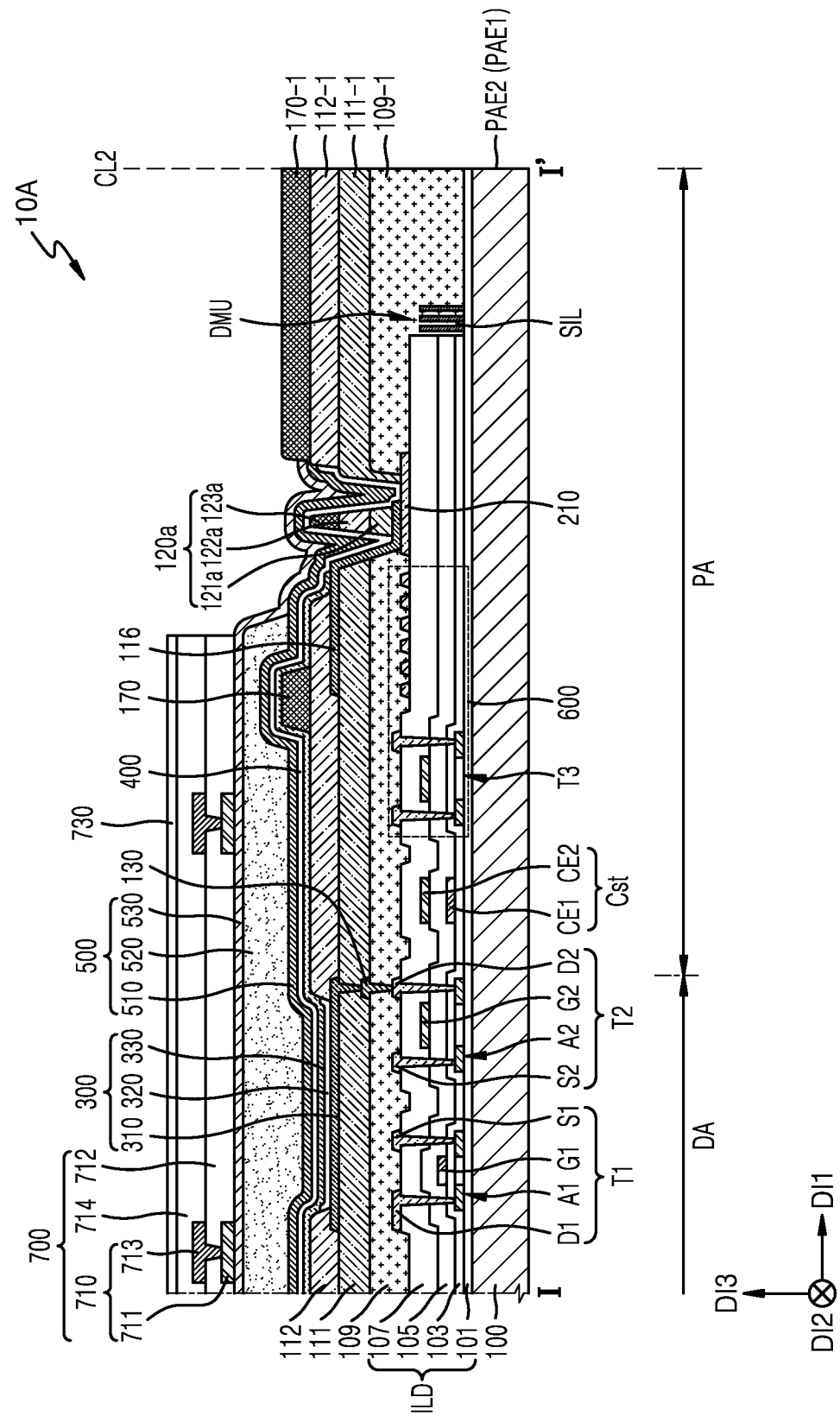
FIG. 10 is a cross-sectional view illustrating part of a display panel according to an embodiment.

FIG. 10 is a cross-sectional view illustrating part of a display panel 10A according to an embodiment.

Referring to FIG. 10, the display panel 10A may include the inorganic insulating layer ILD, the organic insulating layers 109, 111, 112, and 170, the thin-film transistors T1 and T2, the organic light-emitting device 300, the encapsulation layer 500, the touch screen layer 700, the partition wall 120a, the crack blocking unit DMU, and the edge protection unit. The inorganic insulating layer ILD, the organic insulating layers 109, 111, 112, and 170, the thin-film transistors T1 and T2, the organic light-emitting device 300, the encapsulation layer 500, and the touch screen layer 700 may be identical or similar to those described above with reference to FIGS. 4 and 6.

Only one partition wall 120a may be provided between the edge protection unit and the spacer 170. The partition wall 120a may be identical or similar to the first partition wall 120a or the second partition wall 120b shown in FIG. 4.

The crack blocking unit DMU may include the slit SIL. The slit SIL may be substantially identical or similar to the slit SIL shown in one or more of FIGS. 4 to 7.

The edge protection unit may include at least one of the first edge protection layer 109-1, the second edge protection layer 111-1, the third edge protection layer 112-1, and the fourth edge protection layer 170-1.

The edge protection unit may be arranged on the slit SIL and may shield the inorganic insulating layer ILD in the peripheral area PA. Each of the first edge protection layer 109-1 and the second edge protection layer 111-1 may shield at least a portion of the second line 210. The edge protection unit may serve as the second partition wall 120b shown in FIGS. 4 to 6.

The display panel 10A may be separated from portions of the base material through cutting along a first cutting line. A dummy portion DMA may be removed through cutting along the second cutting line CL2. The cutting along the second cutting line CL2 may penetrate through the edge protection unit.

Thus, when the dummy portion DMA is removed along the second cutting line CL2, the edge protection unit may effectively mitigate impact, such that damage to the substrate 100 and/or the display area DA may be minimized or prevented.

Figure 11:
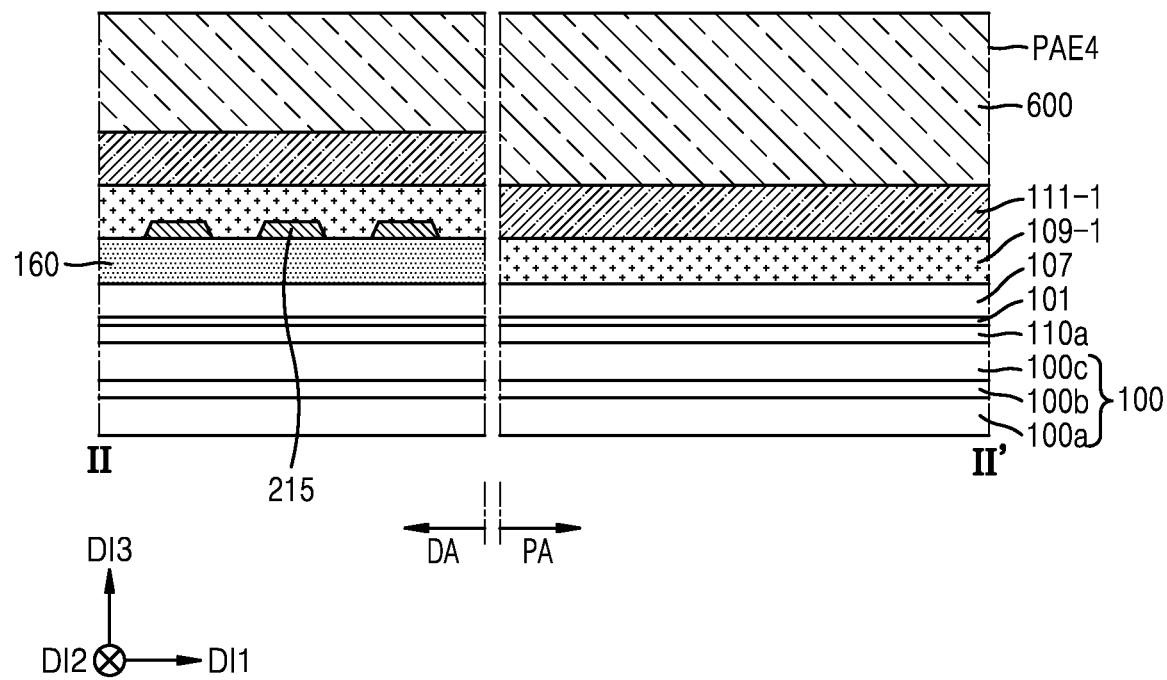
FIG. 11 is a cross-sectional view of the display panel shown in FIG. 3, taken along line II-II' according to an embodiment.

FIG. 11 is a cross-sectional view of the display panel 10A of FIG. 3, taken along line II-II' in FIG. 3, according to an embodiment.

Referring to FIGS. 2 to 11, the display panel 10A may include the bending area BA as. The partition wall 120 and the crack blocking unit DMU may not be arranged on the fourth side PAE4.

The substrate 100 may include one or more materials that are flexible or bendable. The substrate 100 may include a polymer resin such as PES, polyacrylate, PEI, PEN, PET, PPS, PAR, polyimide, PC, and/or CAP. The substrate 100 may have a multi-layered structure including a polymer resin layer 100a, a polymer resin layer 100c, and an inorganic barrier layer 100b located between the layers 100a and 100c. The barrier layer 100b may include $SiO_2$, $SiN_x$, SiON, and/or the like.

A barrier layer 110a (including an inorganic material such as $SiO_2$, $SiN_x$, SiON, and/or the like) and the buffer layer 101 may be located between a thin-film transistor and the substrate 100. The barrier layer 110a may be located between the substrate 100 and the buffer layer 101. The barrier layer 110a and the buffer layer 101 may increase the smoothness of an upper surface of the substrate 100, or may prevent or minimize the penetration of impurities from the substrate 100 or the like into a semiconductor layer of the thin-film transistor.

The display panel 10A shown in one or more of FIGS. 1 to 11 may include a connection line 215, which may extend from the first area 1A to the second area 2A via the bending area BA. The connection line 215 may be located directly on an organic material layer 160. The connection line 215 may be located directly on an inorganic insulation film of an interlayer insulating layer 107, etc., wherein the organic material layer 160 may be optional. The connection line 215, the source electrode of the transistor, and the drain electrode of the transistor may be formed simultaneously and may include a same material.

The edge protection unit may be arranged on the fourth side PAE4 of the display panel. The edge protection unit may include at least one organic insulating layer. The crack blocking unit DMU shown in FIGS. 4 to 7 may not be arranged around the fourth side PAE4.

The edge protection unit may cover the entire bending area BA shown in FIG. 1. The edge protection unit may extend in the first direction DI1 in FIG. 8. The edge protection unit may be formed in an island shape to overlap the fourth side PAE4. The edge protection unit may have a shape similar to a shape of the edge protection unit shown in one or more of FIGS. 4 to 10.

A thickness of the edge protection unit measured on at least one of the first side PAE1, the second side PAE2, and the third side PAE3 may be different from a thickness of the edge protection unit measured on at least part of the fourth side PAE4. The thickness of the edge protection unit measured on at least part of the fourth side PAE4 may be less than the thickness of the edge protection unit measured on at least one of the first side PAE1, the second side PAE2, and the third side PAE3. The thickness of the edge protection unit measured on at least part of the fourth side PAE4 may be different from a thickness of the edge protection unit measured on a remaining part of the fourth side PAE4. A thickness of the edge protection unit measured on a portion of the fourth side PAE4 overlapping the bending area BA may be greater than a thickness of the edge protection unit measured on another portion of the fourth side PAE4. A thickness of the edge protection unit may be adjusted by adjusting a number of edge protection layers arranged in the edge protection unit. The thickness of the edge protection unit may refer to a total thickness of edge protection layers that are stacked.

The edge protection unit arranged on the fourth side PAE4 may include at least one of a first edge protection layer 109-1 and a second edge protection layer 111-1.

The fourth side PAE4 may be curved and bent, such that when the substrate 100 is bent, stress may be concentrated on a curved portion of the fourth side PAE4 or a portion of the fourth side PAE4 that connects a straight-line section of the fourth side PAE4 to a non-straight line section of the fourth side PAE4. Without the edge protection unit, if a crack is present in at least one of the substrate 100 and an inorganic insulating layer overlapping the substrate 100, when the substrate 100 is bent, at least one of the substrate 100 and the inorganic insulating layer may be damaged, or the crack may be transferred to a display area (not shown). The edge protection unit may reduce this problem.

Figure 12:
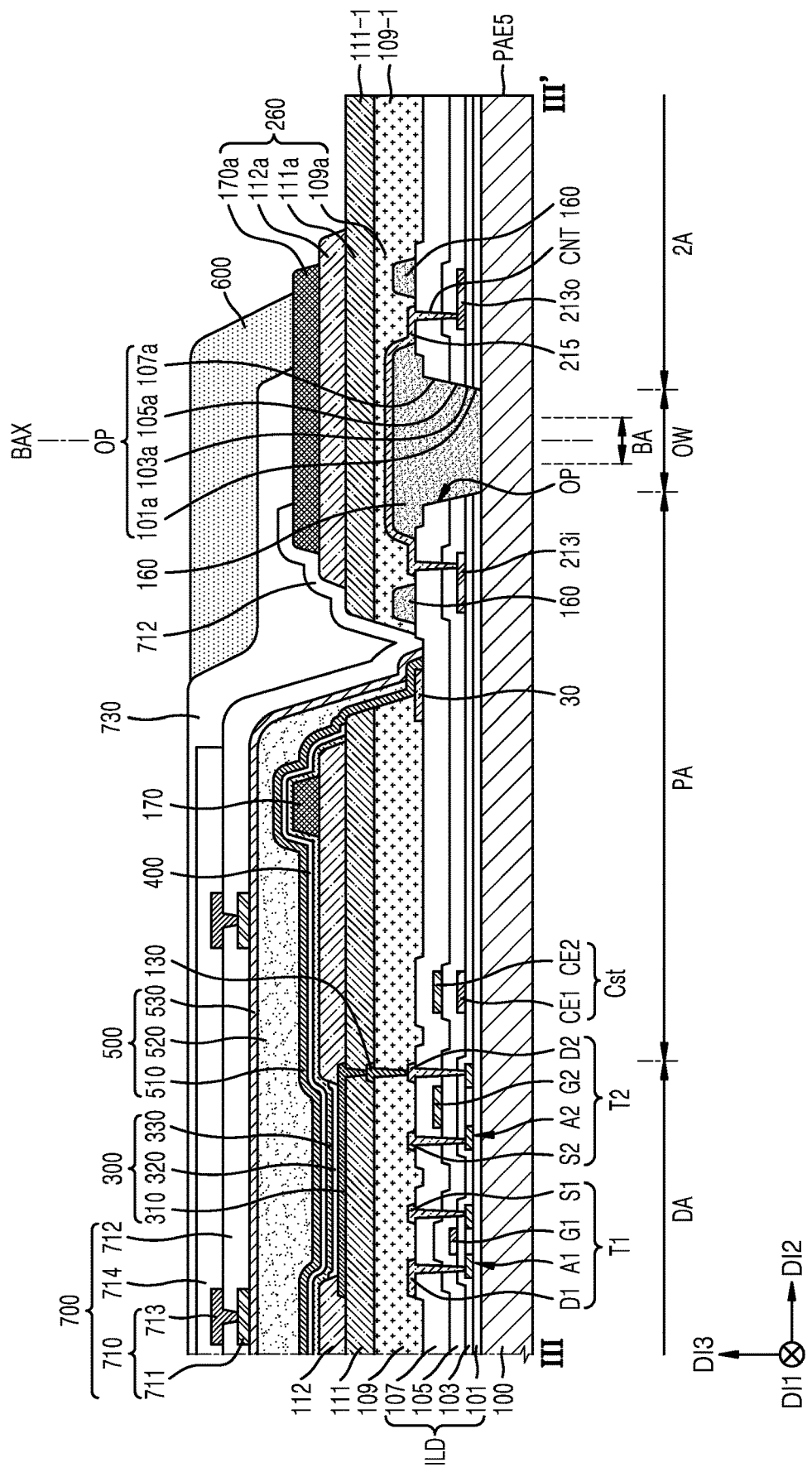
FIG. 12 is a cross-sectional view of the display panel shown in FIG. 3 taken along line III-III' according to an embodiment.

FIG. 12 is a cross-sectional view of the display panel 10A of FIG. 3, taken along line III-III' in FIG. 3, according to an embodiment.

The display panel 10A may have structures shown in one or more of FIGS. 2 to 10. The partition wall 120 and the crack blocking unit DMU shown in one or more of FIGS. 2 to 10 may not be arranged around the fifth side PAE5.

The touch screen layer 700 including the touch electrode 710 of various patterns for a touch screen function may be provided on the encapsulation layer 500. The touch electrode 710 may include the first touch conductive layer 711 connected to the second touch conductive layer 713 in a first direction, and the second touch electrode 713 connected to the first touch conductive layer 711 in a second direction different from (e.g., perpendicular to) the first direction.

The touch electrode 710 may be connected to a touch wire for transmitting a signal detected by the touch electrode 710, and the touch wire may extend from a portion of the encapsulation layer 500 to the peripheral area PA and the second area 2A along one side of the encapsulation layer 500.

A pad area, a driving voltage supply line 30, and a connection line 215 may be arranged in the peripheral area PA and the second area 2A. A common power line, a gate driving unit, a data driving unit, etc. may be further arranged in the peripheral area PA.

The pad area PADA may be arranged at one edge of the peripheral area PA in the first area 1A, and may include terminals. The pad area PADA may be exposed instead of being covered by an insulating layer, and may be electrically connected to a controller, such as a flexible printed circuit board, a driver IC, or the like. The controller may provide data signals, gate signals, a driving voltage ELVDD, and a common voltage ELVSS. The controller may provide a signal to the touch screen layer 700 via the touch wire, and/or may receive a signal detected by the touch screen layer 700.

The driving voltage supply line 30 may be connected to the controller via a driving terminal and may provide the pixels with the driving voltage ELVDD received via the controller. The driving voltage supply line 30 may be arranged in the peripheral area PA and may cover one side of the display area DA.

The connection line 215 may be arranged in the peripheral area PA, and may be connected to a signal line that applies an electrical signal to a thin-film transistor or a display element arranged in the display area DA. The signal line may represent a line arranged inside the display area DA, such as a gate line, a data line, a driving power line, a common voltage line, or the like.

An internal line 213i may be connected to signal lines of the display area DA, an external line 213o may be connected to the pad area PADA, and the connection line 215 may connect the internal line 213i to the external line 213o.

At least part of the connection line 215 may be arranged in/on the bending area BA. The connection line 215 may overlap the bending area BA. The connection line 215 may extend from the first area 1A and may be arranged up to the second area 2A across the bending area BA. The connection line 215 may cross the bending axis. The connection line 215 may obliquely extend at an angle with respect to the bending axis BAX. The connection line 215 may have one or more of various shapes such as a curved-line shape, a zigzag shape, or the like, instead of a straight-line shape. The connection line 215 may be connected to a driving terminal of the pad area and may transmit an electrical signal to the display area DA.

The internal line 213i may be arranged in the first area 1A and may be directly located on a layer different from a layer on which the connection line 215 is directly located, and the internal line 213i may be connected to the connection line 215 through a contact hole. The contact hole may be arranged between the display area DA and the bending area BA. The internal line 213i may be connected to signal lines electrically connected to a thin-film transistor or the like within the display area DA, such that the connection line 215 may be electrically connected to the thin-film transistor or the like within the display area DA.

The external line 213o of the connection line 215 may be arranged in the second area 2A so as to be located on a layer different from a layer on which the connection line 215 is located, and the external line 213o may be connected to the connection line 215 through a contact hole. The contact hole may be arranged between the bending area BA and the pad area PADA. One end of the external line 213o may be connected to a driving terminal of the pad area PADA, such that the connection line 215 may transmit, to the display area DA, an electrical signal of the controller connected to the pad area PADA.

The organic material layer 160 may overlap the bending area BA. Within the bending area BA, a portion of the organic material layer 160 may be arranged between the connection line 215 and the substrate 100.

The internal line 213i, the connection line 215, and the external line 213o may be designed considering tensile stress or the like generated in the bending area BA.

The touch wire may be connected to the touch electrode 710 of the touch screen layer 700 in the display area DA, and may extend from the upper portion of the encapsulation layer 500 and be at least partially arranged in the bending area BA. The touch wire may extend from the first area 1A and be arranged up to the second area 2A across the bending area BA. The touch wire may cross the bending axis BAX. The touch wire may obliquely extend at an angle with respect to the bending axis BAX. The touch wire may have one or more of various shapes such as a curved-line shape, a zigzag shape, or the like, instead of a straight-line shape. The touch wire may be connected to a touch terminal of the pad area PADA, and may exchange electrical signals with the touch screen layer 700.

Unlike the connection line 215, the touch wire may be one continuous wire that extends from the display area DA and is connected to the pad area PADA across the bending area BA. The touch wire may not include connecting lines arranged on different layers, such that the touch wire may not go through a contact hole between the display area DA and the bending area BA.

The inorganic insulating layer ILD may include an opening OP corresponding to the bending area BA. The buffer layer 101, the first gate insulating layer 103, the second gate insulating layer 105, and the interlayer insulating layer 107 may respectively include openings 101a, 103a, 105a, and 107a corresponding to the bending area BA. That the opening OP corresponds to the bending area BA may mean that the opening OP exposes the bending area BA of the substrate 100. An area of the opening OP may be greater than an area of the bending area BA.

A bending protection layer (BPL) 600 may be formed on the touch wire and the connection line 215 and may overlap the bending area BA over the substrate 100. When bending a laminate, a stress neutral plane may be present within the laminate. When the bending area BA is absent, excessive tensile stress or the like may be applied to the touch wire and the connection line 215 within the bending area BA according to a subsequent bending of the substrate 100 or the like. This is because the locations of the touch wire and the connection line 215 may not correspond to the stress neutral plane. By having the BPL 600 with an optimized thickness, a suitable modulus, or the like, a location of a stress neutral plane in a laminate including all of the substrate 100, the touch wire, the connection line 215, and the BPL 600, or the like may be optimized.

An additional upper organic material layer 260 may be arranged between the BPL 600 and the connection line 215 (and/or the touch wire) in the bending area BA. The upper organic material layer 260 may include at least one of a first upper organic material layer 109a, a second upper organic material layer 111a, a third upper organic material layer 112a, and a fourth upper organic material layer 170a, which are stacked on the bending area BA. The first upper organic material layer 109a and the first planarization layer 109 may be located directly on a same layer (and formed of the same material from the same material layer). The second upper organic material layer 111a and the second planarization layer 111 may be located directly on a same layer (and formed of the same material from the same material layer). The third upper organic material layer 112a and the pixel-defining layer 112 may be located directly on a same layer (and formed of the same material from the same material layer). The fourth upper organic material layer 170a and the spacer 170 may be located directly on a same layer (and formed of the same material from the same material layer). The upper organic material layer 260 may be optional. The cover layer 730 and the BPL 600 may be arranged on the touch wire and the connection line 215, or only the BPL 600 may be arranged on the touch wire and the connection line 215.

The fifth side PAE5 may be arranged at an end of the second area 2A. At least a portion of the edge protection unit (e.g., 109-1 and/or 111-1) may be arranged on the fifth side PAE5. The edge protection unit may be arranged in one or more of various shapes. The edge protection unit may be integrally formed with the upper organic material layer 260, and may extend to ends of the bending area BA and the second area 2A. The edge protection unit may extend in the second direction DI2. The edge protection unit may be separated from the upper organic material layer 260. The edge protection unit may be in an island shape and may be spaced from the upper organic material layer 260 in the second direction DI2. An end of the edge protection unit may coincide with the fifth side PAE5.

The edge protection unit may include at least one of the first edge protection layer 109-1, the second edge protection layer 111-1, a third edge protection unit, and a fourth edge protection layer. A thickness of the edge protection unit arranged on the fifth side PAE5 may be equal or unequal to a thickness of the edge protection unit arranged on one from among the first side PAE1, the second side PAE2, the third side PAE3, and the fourth side PAE4. The thickness of the edge protection unit arranged on the fifth side PAE5 may be unequal to a thickness of the edge protection unit arranged on one from among the first side PAE1, the second side PAE2, and the third side PAE3, and may be equal or unequal to a thickness of the edge protection unit arranged on the fourth side PAE4.

When the display panel 10A is separated from portions of the base material, the edge protection unit may prevent cracks from occurring in the substrate 100 and the inorganic insulating layer ILD or may prevent the cracks from extending from around a cutting line to other parts of the display panel 10A.

Thus, in the display panel, even when the substrate 100 is bent in the bending area, the damage of the substrate 100 or the influence that cracks due to the damage of the substrate 100 have on other layers of the display area DA may be minimized.

Figure 13:
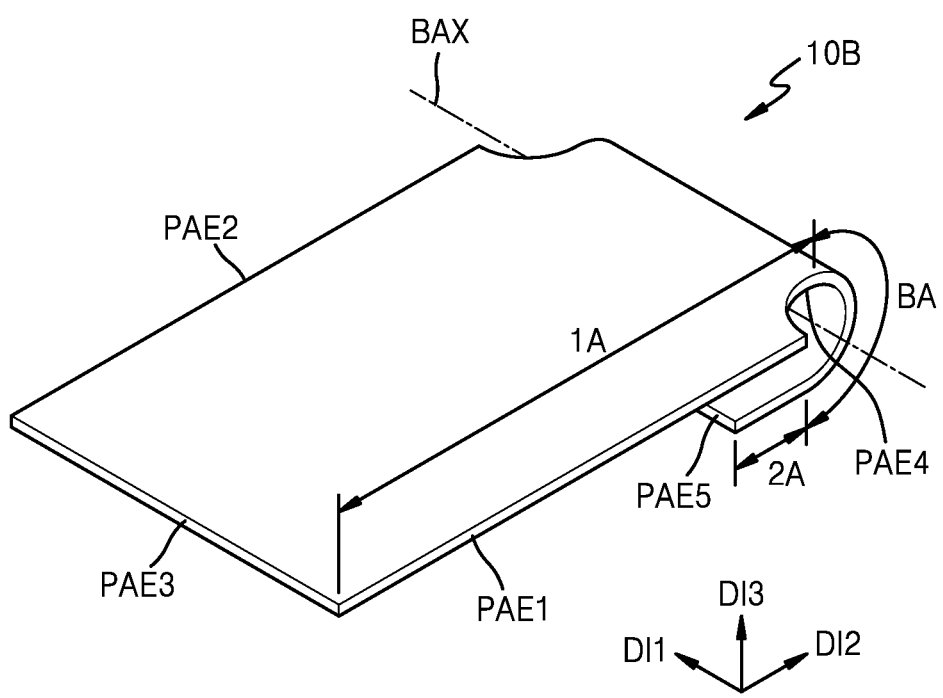
FIG. 13 is a perspective view illustrating a display panel according to an embodiment.

FIG. 13 is a perspective view illustrating a display panel 10B according to an embodiment.

Referring to FIG. 13, the display panel 10B may include a first area 1A, a bending area BA, and a second area 2A. The first area 1A may have a quadrilateral shape. At least a portion of the bending area BA may be curved. Without an edge protection unit, when the display panel 10A is bent, stress may be concentrated on the bending area BA.

In the manufacturing of the display panel 10B, when a crack is generated around the bending area BA, the display panel 10B may be damaged due to a bending of the bending area BA. An edge protection unit may be arranged on each of sides of the display panel 10B so as to prevent the aforementioned problem. The edge protection unit arranged on a first side PAE1, a second side PAE2, and a third side PAE3 may have one or more structures shown in one or more of FIGS. 4 to 8, FIG. 9, and/or FIG. 10. The edge protection unit arranged on each of the fourth side PAE4 and the fifth side PAE5 may have one or more structures shown in one or more of FIGS. 4 to 8, FIG. 9, FIG. 10, and/or FIGS. 11 and 12.

A display device according to embodiments of the present disclosure may not be significantly broken or damaged. Embodiments of the present disclosure may prevent a connection portion of a first area and a second area from being damaged.

The embodiments described herein are illustrative and not for purposes of limitation. Descriptions of features within each of the embodiments should be available for other similar features in other embodiments. While example embodiments have been described with reference to the figures, various changes in form and details may be made without departing from the scope defined by the following claims.

What is claimed is:

1. A display device comprising:
   a substrate including a first area, a second area, and a bent area, wherein the bent area is connected between the first area and the second area, is bent according to a bending axis, and is narrower than the first area in a direction parallel to the bending axis;

a display element overlapping the substrate; and an edge protection unit comprising an organic insulating layer, the edge protection unit being spaced from the display element, arranged at an edge of the substrate, and only partially overlapping the substrate, wherein the edge protection unit comprises a face disposed at an outermost side of the substrate, and the face of the edge protection unit is coplanar with the edge of the substrate.

2. The display device of claim 1, further comprising:

a planarization layer spaced from the organic insulating layer and positioned between the display element and the substrate;

a pixel-defining layer spaced from the organic insulating layer and directly contacting the display element; and a spacer spaced from the organic insulating layer, wherein the pixel-defining layer is positioned between the spacer and the substrate, and wherein the organic insulating layer is formed of a same material as at least one of the planarization layer, the pixel-defining layer, and the spacer.

3. The display device of claim 1, further comprising: an inorganic insulating layer arranged between the substrate and the organic insulating layer.

4. The display device of claim 3, wherein the inorganic insulating layer is positioned between the second area and the organic insulating layer.

5. The display device of claim 1, further comprising: a buffer layer arranged between the substrate and the organic insulating layer.

6. The display device of claim 5, wherein the buffer layer is positioned between the organic insulating layer and the first area.

7. The display device of claim 1, wherein the first area comprises:

a display area; and a peripheral area surrounding the display area, and wherein the display element overlaps the display area.

8. The display device of claim 1, further comprising: a bending protection layer overlapping the bent area and partially overlapping the organic insulating layer, wherein the organic insulating layer is positioned between the bending protection layer and the bent area.

9. A display device comprising:

a substrate including a first area, a second area, and a bent area, wherein the bent area is connected between the first area and the second area, is bent according to a bending axis, and is narrower than the first area in a direction parallel to the bending axis, wherein the first area comprises:

a display area; and a peripheral area surrounding the display area, and wherein the display element overlaps the display area;

a display element overlapping the substrate;

an organic insulating layer spaced from the display element, arranged at an edge of the substrate, and only partially overlapping the substrate, wherein a face of the organic insulating layer is coplanar with the edge of the substrate; and a crack blocking unit arranged on the peripheral area and including a slit.

10. The display device of claim 9, wherein the organic insulating layer covers at least one of the crack blocking unit and the slit.

11. A display device comprising:

a substrate comprising a first side, a second side, a third side connected between the first side and the second side, two fourth sides each having a curved section, and a fifth side connected through the two fourth sides to the first side and the second side, respectively;

a display element overlapping the substrate; and an edge protection unit comprising an organic insulating layer, the edge protection unit being spaced from the display element and only partially overlapping the substrate, and wherein the edge protection unit comprises a face disposed at an outermost side of the substrate, and the face of the edge protection unit is coplanar with the first side, the second side, the third side, a straight section of one of the two fourth sides, or the fifth side.

12. The display device of claim 11, wherein widths of the substrate between the two fourth sides decrease toward the fifth side.

13. The display device of claim 11, wherein the two fourth sides are bent according to a same bending axis.

14. The display device of claim 13, further comprising: a bending protection layer covering a bent portion of the substrate that is positioned between the two fourth sides.

15. The display device of claim 14, wherein the bending protection layer partially overlaps the organic insulation layer, and wherein the organic insulating layer is arranged between the bending protection layer and the bent portion of the substrate.

16. The display device of claim 11, wherein the edge protection unit includes four faces respectively coplanar with the first side, the second side, the third side, and the fifth side and includes two surfaces respectively conforming to the two fourth sides.

17. The display device of claim 11, wherein a thickness of the organic insulating layer is constant on the first side, the second side, and the third side.

18. The display device of claim 11, wherein a thickness of the organic insulating layer on one of the two fourth sides or the fifth side is unequal to a thickness of the organic insulating layer on one of the first side, the second side, and the third side.

19. A display device comprising:

a substrate comprising a edge side, a second side, a third side connected between the first side and the second side, two fourth sides each having a curved section, and a fifth side connected through the two fourth sides to the first side and the second side, respectively;

a display element overlapping the substrate;

an organic insulating layer spaced from the display element and only partially overlapping the substrate, and wherein a face of the organic insulating layer is coplanar with the first side, the second side, the third side, a straight section of one of the two fourth sides, or the fifth side; and a crack blocking unit overlapping the substrate and including a slit, wherein a portion of the organic insulating layer is positioned between the slit and the first side, the second side, or the third side.

20. The display device of claim 19, wherein a remaining portion of the organic insulating layer covers at least one of the crack blocking unit and the slit.

* * * * *